(12) United States Patent
Malet et al.

(10) Patent No.: US 8,815,341 B2
(45) Date of Patent: *Aug. 26, 2014

(54) CARBON FIBER SUBSTRATES HAVING CARBON NANOTUBES GROWN THEREON AND PROCESSES FOR PRODUCTION THEREOF

(75) Inventors: Brandon K. Malet, Baltimore, MD (US); Tushar K. Shah, Fulton, MD (US)

(73) Assignee: Applied NanoStructured Solutions, LLC, Baltimore, MD (US)

( * ) Notice: Subject to any disclaimer, the term of this patent is extended or adjusted under 35 U.S.C. 154(b) by 397 days.

This patent is subject to a terminal disclaimer.

(21) Appl. No.: 13/231,869

(22) Filed: Sep. 13, 2011

(65) Prior Publication Data

US 2012/0070667 A1 Mar. 22, 2012

Related U.S. Application Data

(60) Provisional application No. 61/385,532, filed on Sep. 22, 2010.

(51) Int. Cl.

| | | |
|---|---|---|
| *C23C 16/00* | (2006.01) | |
| *B82Y 30/00* | (2011.01) | |
| *C23C 16/54* | (2006.01) | |
| *C23C 16/458* | (2006.01) | |
| *C23C 16/26* | (2006.01) | |
| *B82Y 40/00* | (2011.01) | |
| *C01B 31/02* | (2006.01) | |

(52) U.S. Cl.
CPC ............... *B82Y 30/00* (2013.01); *C23C 16/545* (2013.01); *C23C 16/458* (2013.01); *C23C 16/26* (2013.01); *B05D 2256/00* (2013.01); *B82Y 40/00* (2013.01); *C01B 31/022* (2013.01); *C01B 31/0233* (2013.01); *C01B 2202/34* (2013.01); *C01B 2202/36* (2013.01); *Y10S 977/843* (2013.01); *Y10S 977/891* (2013.01)
USPC .................. 427/249.3; 427/249.1; 427/255.5; 427/301; 977/843; 977/891

(58) Field of Classification Search
USPC .................................... 427/248.1, 299, 249.1
See application file for complete search history.

(56) References Cited

U.S. PATENT DOCUMENTS

| | | | |
|---|---|---|---|
| 4,300,821 A | 11/1981 | Mignen | |
| 4,515,107 A | 5/1985 | Fournier et al. | |
| 4,530,750 A | 7/1985 | Alsenberg et al. | |
| 4,707,349 A | 11/1987 | Hjersted | |
| 4,797,378 A | 1/1989 | Sowman | |
| 4,920,917 A | 5/1990 | Nakatani et al. | |
| 5,093,155 A | 3/1992 | Miyazaki et al. | |
| 5,130,194 A | 7/1992 | Baker et al. | |
| 5,173,367 A | 12/1992 | Liimatta et al. | |
| 5,221,605 A | 6/1993 | Bard et al. | |
| 5,225,659 A | 7/1993 | Kusano et al. | |
| 5,238,808 A | 8/1993 | Bard et al. | |
| 5,246,794 A | 9/1993 | Blomgren et al. | |
| 5,310,687 A | 5/1994 | Bard et al. | |
| 5,470,408 A | 11/1995 | Nielson et al. | |
| 5,514,217 A | 5/1996 | Niino et al. | |
| 5,547,525 A | 8/1996 | Bennett et al. | |
| 5,571,749 A | 11/1996 | Matsuda et al. | |
| 5,595,750 A | 1/1997 | Jacobson et al. | |
| 5,639,984 A | 6/1997 | Nielson | |
| 5,714,089 A | 2/1998 | Bard et al. | |
| 5,731,147 A | 3/1998 | Bard et al. | |
| 5,764,004 A | 6/1998 | Rabinowitz | |
| 5,780,101 A | 7/1998 | Nolan et al. | |
| 5,908,585 A | 6/1999 | Shibuta | |
| 5,968,274 A | 10/1999 | Fujioka et al. | |
| 5,997,832 A | 12/1999 | Lieber et al. | |
| 6,072,930 A | 6/2000 | Kornreich et al. | |
| 6,140,138 A | 10/2000 | Bard et al. | |
| 6,146,462 A | 11/2000 | Yializis et al. | |
| 6,146,642 A | 11/2000 | Garcia-Sastre et al. | |
| 6,184,280 B1 | 2/2001 | Shibuta | |

(Continued)

FOREIGN PATENT DOCUMENTS

| | | |
|---|---|---|
| CA | 2476881 A1 | 9/2003 |
| CN | 1345694 | 4/2002 |

(Continued)

OTHER PUBLICATIONS

"Conformal coating", The Free Dictionary by Farlex, last viewed Jan. 15, 2013, retrieved from <http://encyclopedia.thefreedictionary.com/conformal+coating>.

Keyvani, "Huge Opportunities for Industry of Nanofibrous Concrete Technology," International Journal of Nanoscience and Nonotechnology, Dec. 2007, pp. 3-11, vol. 3, No. 1.

Yamamoto, et al., "High-yield growth and morphology control of aligned carbon nanotubes on ceramic fibers for multifunctional enhancement of structural composites," Carbon, Mar. 2009, vol. 47, No. 3, pp. 551-560.

Ci, et al., "Direct growth of carbon nanotubes on the surface of ceramic fibers," Carbon, Jan. 2005, vol. 43, No. 4, pp. 883-886.

Ago, et al., "Colloidal Solution of Metal Nanoparticles as a Catalyst for Carbon Nanotube Growth", Proceedings Materials Research Society, Fall 2000, pp. A13.18.1-A13.18.5, vol. 633, Materials Research Society.

(Continued)

*Primary Examiner* — David Turocy
(74) *Attorney, Agent, or Firm* — McDermott Will & Emery LLP

(57) ABSTRACT

Processes for growing carbon nanotubes on carbon fiber substrates are described herein. The processes can include depositing a catalyst precursor on a carbon fiber substrate, optionally depositing a non-catalytic material on the carbon fiber substrate, and after depositing the catalyst precursor and the optional non-catalytic material, exposing the carbon fiber substrate to carbon nanotube growth conditions so as to grow carbon nanotubes thereon. The carbon nanotube growth conditions can convert the catalyst precursor into a catalyst that is operable for growing carbon nanotubes. The carbon fiber substrate can remain stationary or be transported while the carbon nanotubes are being grown. Optionally, the carbon fiber substrates can include a barrier coating and/or be free of a sizing agent. Carbon fiber substrates having carbon nanotubes grown thereon are also described.

15 Claims, 5 Drawing Sheets

(56) References Cited

U.S. PATENT DOCUMENTS

| | | | |
|---|---|---|---|
| 6,221,154 B1 | 4/2001 | Lee et al. |
| 6,232,706 B1 | 5/2001 | Dai et al. |
| 6,251,520 B1 | 6/2001 | Blizzard et al. |
| 6,270,897 B1 | 8/2001 | Flautt et al. |
| 6,331,209 B1 | 12/2001 | Jang et al. |
| 6,333,016 B1 | 12/2001 | Resasco et al. |
| 6,361,861 B2 | 3/2002 | Gao |
| 6,413,487 B1 | 7/2002 | Resasco et al. |
| 6,420,293 B1 | 7/2002 | Chang et al. |
| 6,440,277 B1 | 8/2002 | D'Amato |
| 6,455,021 B1 | 9/2002 | Saito |
| 6,465,057 B1 | 10/2002 | Nakahigashi et al. |
| 6,479,028 B1 | 11/2002 | Kaner et al. |
| 6,491,789 B2 | 12/2002 | Niu |
| 6,495,258 B1 | 12/2002 | Chen et al. |
| 6,528,572 B1 | 3/2003 | Patel et al. |
| 6,564,744 B2 | 5/2003 | Nakahigashi et al. |
| 6,653,619 B2 | 11/2003 | Chin et al. |
| 6,673,392 B2 | 1/2004 | Lee et al. |
| 6,692,717 B1 | 2/2004 | Smalley et al. |
| 6,765,949 B2 | 7/2004 | Chang |
| 6,790,425 B1 | 9/2004 | Smalley et al. |
| 6,818,821 B2 | 11/2004 | Fujieda et al. |
| 6,837,928 B1 | 1/2005 | Zhang et al. |
| 6,852,410 B2 | 2/2005 | Veedu et al. |
| 6,863,942 B2 | 3/2005 | Ren et al. |
| 6,887,451 B2 | 5/2005 | Dodelet et al. |
| 6,900,264 B2 | 5/2005 | Kumar et al. |
| 6,900,580 B2 | 5/2005 | Dai et al. |
| 6,908,572 B1 | 6/2005 | Derbyshire et al. |
| 6,913,075 B1 | 7/2005 | Knowless et al. |
| 6,934,600 B2 | 8/2005 | Jang et al. |
| 6,936,653 B2 | 8/2005 | McElrath et al. |
| 6,955,800 B2 | 10/2005 | Resasco et al. |
| 6,962,892 B2 | 11/2005 | Resasco et al. |
| 6,967,013 B2 | 11/2005 | Someya et al. |
| 6,979,709 B2 | 12/2005 | Smalley et al. |
| 6,986,853 B2 | 1/2006 | Glatkowski et al. |
| 6,986,877 B2 | 1/2006 | Takikawa et al. |
| 6,994,907 B2 | 2/2006 | Resasco et al. |
| 7,011,760 B2 | 3/2006 | Wang et al. |
| 7,018,600 B2 | 3/2006 | Yanagisawa et al. |
| 7,022,776 B2 | 4/2006 | Bastiaens et al. |
| 7,045,108 B2 | 5/2006 | Jiang et al. |
| 7,056,452 B2 | 6/2006 | Niu et al. |
| 7,074,294 B2 | 7/2006 | Dubrow |
| 7,094,386 B2 | 8/2006 | Resasco et al. |
| 7,105,596 B2 | 9/2006 | Smalley et al. |
| 7,108,841 B2 | 9/2006 | Smalley et al. |
| 7,118,693 B2 | 10/2006 | Glatkowski et al. |
| 7,125,533 B2 * | 10/2006 | Khabashesku et al. ..... 423/447.1 |
| 7,125,534 B1 | 10/2006 | Smalley et al. |
| 7,132,621 B2 | 11/2006 | Kumar et al. |
| 7,144,563 B2 | 12/2006 | Rao et al. |
| 7,148,619 B2 | 12/2006 | Den et al. |
| 7,151,129 B2 | 12/2006 | Ishikawa et al. |
| 7,153,452 B2 | 12/2006 | Ogale et al. |
| 7,157,068 B2 | 1/2007 | Li et al. |
| 7,160,531 B1 | 1/2007 | Jacques et al. |
| 7,160,532 B2 * | 1/2007 | Liu et al. ..................... 423/447.3 |
| 7,211,320 B1 | 5/2007 | Cooper et al. |
| 7,226,643 B2 | 6/2007 | Juang et al. |
| 7,235,159 B2 | 6/2007 | Gu et al. |
| 7,239,073 B2 | 7/2007 | Takikawa et al. |
| 7,253,442 B2 | 8/2007 | Huang et al. |
| 7,261,779 B2 | 8/2007 | Gardner |
| 7,265,174 B2 | 9/2007 | Carroll et al. |
| 7,265,175 B2 | 9/2007 | Winey et al. |
| 7,278,324 B2 | 10/2007 | Smits et al. |
| 7,294,302 B2 | 11/2007 | Koide et al. |
| 7,329,698 B2 | 2/2008 | Noguchi et al. |
| 7,338,684 B1 | 3/2008 | Curliss et al. |
| 7,354,881 B2 | 4/2008 | Resasco et al. |
| 7,354,988 B2 | 4/2008 | Charati et al. |
| 7,372,880 B2 | 5/2008 | Jablonski et al. |
| 7,384,663 B2 | 6/2008 | Oiry et al. |
| 7,399,794 B2 | 7/2008 | Harmon et al. |
| 7,407,640 B2 | 8/2008 | Barrera et al. |
| 7,407,901 B2 | 8/2008 | Bystricky et al. |
| 7,410,628 B2 | 8/2008 | Bening et al. |
| 7,419,601 B2 | 9/2008 | Cooper et al. |
| 7,431,965 B2 | 10/2008 | Grigorian et al. |
| 7,445,817 B2 | 11/2008 | Kumar et al. |
| 7,448,441 B2 | 11/2008 | Hendricks et al. |
| 7,448,931 B2 | 11/2008 | Liu et al. |
| 7,459,627 B2 | 12/2008 | Lee et al. |
| 7,465,605 B2 | 12/2008 | Raravikar et al. |
| 7,473,466 B1 | 1/2009 | Muradov |
| 7,479,052 B2 | 1/2009 | Kim et al. |
| 7,488,455 B2 | 2/2009 | Dai et al. |
| 7,494,639 B2 * | 2/2009 | Marek et al. .................. 423/461 |
| 7,504,078 B1 | 3/2009 | Jacques et al. |
| 7,510,695 B2 | 3/2009 | Smalley et al. |
| 7,534,486 B2 | 5/2009 | Boerstoel et al. |
| 7,563,411 B2 | 7/2009 | Jiang et al. |
| 7,563,428 B2 | 7/2009 | Resasco et al. |
| 7,569,425 B2 | 8/2009 | Huang et al. |
| 7,588,700 B2 | 9/2009 | Kwon et al. |
| 7,592,248 B2 | 9/2009 | Ventzek et al. |
| 7,597,869 B2 | 10/2009 | Hsiao |
| 7,608,798 B2 | 10/2009 | Kumar et al. |
| 7,611,579 B2 | 11/2009 | Lashmore et al. |
| 7,615,204 B2 | 11/2009 | Ajayan et al. |
| 7,615,205 B2 | 11/2009 | Jiang et al. |
| 7,632,550 B2 | 12/2009 | Mizuno et al. |
| 7,632,569 B2 | 12/2009 | Smalley et al. |
| 7,656,027 B2 | 2/2010 | Dangelo et al. |
| 7,666,915 B2 * | 2/2010 | Zhang et al. ..................... 516/32 |
| 7,687,981 B2 | 3/2010 | Parsapour |
| 7,700,943 B2 | 4/2010 | Raravikar et al. |
| 7,709,087 B2 | 5/2010 | Majidi et al. |
| 7,718,220 B2 | 5/2010 | D'Silva et al. |
| 7,771,798 B1 | 8/2010 | Grosse et al. |
| 7,776,777 B2 | 8/2010 | Kim et al. |
| 7,811,632 B2 | 10/2010 | Eres |
| 7,815,820 B2 | 10/2010 | Tan et al. |
| 7,816,709 B2 | 10/2010 | Balzano et al. |
| 7,862,795 B2 | 1/2011 | Zhang et al. |
| 7,867,468 B1 | 1/2011 | Haddon et al. |
| 7,871,591 B2 | 1/2011 | Harutyunyan et al. |
| 7,880,376 B2 | 2/2011 | Takai et al. |
| 7,927,701 B2 | 4/2011 | Curliss et al. |
| 8,148,276 B2 | 4/2012 | Nejhad et al. |
| 8,168,291 B2 * | 5/2012 | Shah et al. ................. 428/293.4 |
| 2002/0035170 A1 | 3/2002 | Glatkowski et al. |
| 2002/0085968 A1 | 7/2002 | Smalley et al. |
| 2002/0102201 A1 | 8/2002 | Colbert et al. |
| 2002/0197474 A1 | 12/2002 | Reynolds |
| 2003/0042147 A1 * | 3/2003 | Talin et al. ..................... 205/238 |
| 2003/0068432 A1 | 4/2003 | Dai et al. |
| 2003/0102585 A1 | 6/2003 | Poulin et al. |
| 2003/0111333 A1 | 6/2003 | Montgomery et al. |
| 2003/0175003 A1 | 9/2003 | Gasca et al. |
| 2004/0007955 A1 | 1/2004 | Yaniv et al. |
| 2004/0026234 A1 | 2/2004 | Vandern Brande et al. |
| 2004/0079278 A1 | 4/2004 | Kamins et al. |
| 2004/0082247 A1 | 4/2004 | Desai et al. |
| 2004/0089237 A1 | 5/2004 | Pruett et al. |
| 2004/0105807 A1 | 6/2004 | Fan et al. |
| 2004/0245088 A1 | 12/2004 | Gardner |
| 2004/0247808 A1 | 12/2004 | Cooper et al. |
| 2004/0253167 A1 | 12/2004 | Silva et al. |
| 2005/0009694 A1 | 1/2005 | Watts et al. |
| 2005/0026778 A1 | 2/2005 | Axtell et al. |
| 2005/0090176 A1 * | 4/2005 | Dean et al. ..................... 445/51 |
| 2005/0093458 A1 | 5/2005 | Babayan et al. |
| 2005/0100501 A1 | 5/2005 | Veedu et al. |
| 2005/0112052 A1 | 5/2005 | Gu et al. |
| 2005/0119105 A1 | 6/2005 | Zimmer et al. |
| 2005/0119371 A1 | 6/2005 | Drzal et al. |
| 2005/0147553 A1 * | 7/2005 | Wong et al. ................. 423/447.2 |
| 2005/0164169 A1 | 7/2005 | Malak |
| 2005/0170089 A1 | 8/2005 | Lashmore et al. |
| 2005/0172370 A1 | 8/2005 | Haq et al. |

(56) References Cited

U.S. PATENT DOCUMENTS

| | | |
|---|---|---|
| 2005/0176329 A1* | 8/2005 | Olry et al. .................... 442/388 |
| 2005/0188727 A1 | 9/2005 | Greywall |
| 2005/0191490 A1 | 9/2005 | Ton-That et al. |
| 2005/0215164 A1 | 9/2005 | Mueller et al. |
| 2005/0245622 A1 | 11/2005 | Beijense et al. |
| 2005/0260412 A1 | 11/2005 | Gardner |
| 2005/0263456 A1 | 12/2005 | Cooper et al. |
| 2005/0287064 A1 | 12/2005 | Mayne et al. |
| 2006/0002844 A1 | 1/2006 | Suenaga et al. |
| 2006/0052509 A1 | 3/2006 | Saitoh |
| 2006/0062944 A1 | 3/2006 | Gardner et al. |
| 2006/0067871 A1 | 3/2006 | Hart et al. |
| 2006/0083674 A1* | 4/2006 | Maruyama et al. ........ 423/447.3 |
| 2006/0083927 A1 | 4/2006 | Von Ehr |
| 2006/0104890 A1* | 5/2006 | Harutyunyan et al. .... 423/447.3 |
| 2006/0110599 A1 | 5/2006 | Honma et al. |
| 2006/0121275 A1 | 6/2006 | Poulin et al. |
| 2006/0159916 A1 | 7/2006 | Dubrow et al. |
| 2006/0165914 A1 | 7/2006 | Abrahamson |
| 2006/0172179 A1 | 8/2006 | Gu et al. |
| 2006/0177602 A1 | 8/2006 | Dijon et al. |
| 2006/0198956 A1 | 9/2006 | Eres |
| 2006/0205304 A1 | 9/2006 | Marzolin et al. |
| 2007/0009421 A1 | 1/2007 | Kittrell et al. |
| 2007/0020167 A1 | 1/2007 | Han et al. |
| 2007/0035226 A1 | 2/2007 | Ganapathiraman et al. |
| 2007/0048521 A1 | 3/2007 | Istvan |
| 2007/0053824 A1 | 3/2007 | Subramanya et al. |
| 2007/0054105 A1 | 3/2007 | Hsiao |
| 2007/0090489 A1 | 4/2007 | Hart et al. |
| 2007/0092431 A1 | 4/2007 | Resasco et al. |
| 2007/0103048 A1 | 5/2007 | Liu et al. |
| 2007/0110977 A1 | 5/2007 | Al-Haik et al. |
| 2007/0128960 A1 | 6/2007 | Ghasemi Jejhad et al. |
| 2007/0135588 A1 | 6/2007 | Diakoumakos et al. |
| 2007/0141114 A1 | 6/2007 | Muisener et al. |
| 2007/0148340 A1 | 6/2007 | Kalkanoglu et al. |
| 2007/0148429 A1 | 6/2007 | McGrath et al. |
| 2007/0183959 A1 | 8/2007 | Charlier et al. |
| 2007/0189953 A1 | 8/2007 | Bai et al. |
| 2007/0205394 A1 | 9/2007 | Furman et al. |
| 2007/0218280 A1 | 9/2007 | Yabuki et al. |
| 2007/0253890 A1 | 11/2007 | Nakayama et al. |
| 2007/0259128 A1 | 11/2007 | Parsapour |
| 2007/0298669 A1 | 12/2007 | Barrera et al. |
| 2008/0014431 A1 | 1/2008 | Lashmore et al. |
| 2008/0017845 A1 | 1/2008 | Drndic et al. |
| 2008/0020193 A1 | 1/2008 | Jang et al. |
| 2008/0023396 A1 | 1/2008 | Fugetsu |
| 2008/0048364 A1 | 2/2008 | Armeniades et al. |
| 2008/0053922 A1 | 3/2008 | Honsinger, Jr. et al. |
| 2008/0069760 A1 | 3/2008 | O'Brien et al. |
| 2008/0075954 A1 | 3/2008 | Wardle et al. |
| 2008/0118753 A1 | 5/2008 | Poulin et al. |
| 2008/0135815 A1 | 6/2008 | Glatkowski et al. |
| 2008/0160286 A1 | 7/2008 | Asrar et al. |
| 2008/0160302 A1 | 7/2008 | Asrar et al. |
| 2008/0170982 A1 | 7/2008 | Zhang et al. |
| 2008/0181839 A1 | 7/2008 | Arendt et al. |
| 2008/0182108 A1 | 7/2008 | Curliss et al. |
| 2008/0187648 A1 | 8/2008 | Hart et al. |
| 2008/0213498 A1 | 9/2008 | Drzal et al. |
| 2008/0247938 A1 | 10/2008 | Tsai et al. |
| 2008/0247939 A1 | 10/2008 | Iyuke |
| 2008/0274036 A1 | 11/2008 | Resasco et al. |
| 2008/0279753 A1 | 11/2008 | Harutyunyan |
| 2008/0280031 A1 | 11/2008 | Drzal et al. |
| 2008/0280136 A1* | 11/2008 | Zachariah et al. ............ 428/367 |
| 2008/0286564 A1 | 11/2008 | Tsotsis |
| 2008/0287598 A1 | 11/2008 | Lee |
| 2008/0290787 A1 | 11/2008 | Cok |
| 2008/0305329 A1 | 12/2008 | D'Silva et al. |
| 2008/0308209 A1 | 12/2008 | Loutfy et al. |
| 2009/0017301 A1 | 1/2009 | Moireau |
| 2009/0020734 A1 | 1/2009 | Jang et al. |
| 2009/0021136 A1 | 1/2009 | Coll et al. |
| 2009/0047453 A1 | 2/2009 | Folaron et al. |
| 2009/0047502 A1 | 2/2009 | Folaron et al. |
| 2009/0068387 A1 | 3/2009 | Panzer et al. |
| 2009/0068461 A1 | 3/2009 | Reneker et al. |
| 2009/0081383 A1 | 3/2009 | Alberding et al. |
| 2009/0081441 A1 | 3/2009 | Shah et al. |
| 2009/0092832 A1 | 4/2009 | Moireau |
| 2009/0099016 A1 | 4/2009 | Carruthers et al. |
| 2009/0116798 A1 | 5/2009 | Blanchandin et al. |
| 2009/0121219 A1 | 5/2009 | Song et al. |
| 2009/0126783 A1 | 5/2009 | Lin et al. |
| 2009/0136707 A1 | 5/2009 | Ueno |
| 2009/0140098 A1 | 6/2009 | Lengsfeld et al. |
| 2009/0176100 A1 | 7/2009 | Higashi et al. |
| 2009/0176112 A1 | 7/2009 | Kruckenberg et al. |
| 2009/0186214 A1 | 7/2009 | Lafdi et al. |
| 2009/0191352 A1 | 7/2009 | DuFaux et al. |
| 2009/0192241 A1 | 7/2009 | Raravikar et al. |
| 2009/0202422 A1* | 8/2009 | Kajiura et al. ............. 423/447.2 |
| 2009/0212430 A1 | 8/2009 | Wyland |
| 2009/0214800 A1 | 8/2009 | Saito |
| 2009/0220409 A1 | 9/2009 | Curliss et al. |
| 2009/0258164 A1 | 10/2009 | Nakai et al. |
| 2009/0286079 A1 | 11/2009 | Barket et al. |
| 2009/0294753 A1 | 12/2009 | Hauge et al. |
| 2009/0311166 A1 | 12/2009 | Hart et al. |
| 2009/0311168 A1 | 12/2009 | Duvall |
| 2009/0318614 A1 | 12/2009 | Chevalier |
| 2009/0325377 A1 | 12/2009 | DiJon et al. |
| 2010/0000770 A1 | 1/2010 | Gupta et al. |
| 2010/0059243 A1 | 3/2010 | Chang |
| 2010/0074834 A1 | 3/2010 | Kim |
| 2010/0092841 A1 | 4/2010 | Lopez et al. |
| 2010/0098931 A1 | 4/2010 | Daniel et al. |
| 2010/0099319 A1 | 4/2010 | Lashmore et al. |
| 2010/0117764 A1 | 5/2010 | Wang et al. |
| 2010/0159240 A1 | 6/2010 | Shah et al. |
| 2010/0178825 A1* | 7/2010 | Shah et al. .................... 442/188 |
| 2010/0188833 A1 | 7/2010 | Liang et al. |
| 2010/0192851 A1 | 8/2010 | Shah et al. |
| 2010/0196697 A1 | 8/2010 | D'Silva et al. |
| 2010/0197848 A1 | 8/2010 | Verghese et al. |
| 2010/0200208 A1 | 8/2010 | Cola et al. |
| 2010/0206504 A1 | 8/2010 | Akiyama et al. |
| 2010/0210159 A1 | 8/2010 | Zhu |
| 2010/0221424 A1 | 9/2010 | Malecki et al. |
| 2010/0224129 A1* | 9/2010 | Malecki et al. ............ 118/723 R |
| 2010/0227134 A1 | 9/2010 | Shah et al. |
| 2010/0254885 A1 | 10/2010 | Menchhofer et al. |
| 2010/0260931 A1 | 10/2010 | Malecki et al. |
| 2010/0260933 A1 | 10/2010 | Malecki et al. |
| 2010/0260998 A1 | 10/2010 | Waicukauski et al. |
| 2010/0272891 A1 | 10/2010 | Malecki et al. |
| 2010/0276072 A1 | 11/2010 | Shah et al. |
| 2010/0279569 A1 | 11/2010 | Shah et al. |
| 2010/0311866 A1 | 12/2010 | Huang et al. |
| 2011/0014446 A1 | 1/2011 | Saito |
| 2011/0024409 A1 | 2/2011 | Shah et al. |
| 2011/0024694 A1 | 2/2011 | Shah |
| 2011/0132245 A1 | 6/2011 | Shah et al. |
| 2011/0186775 A1 | 8/2011 | Shah et al. |
| 2011/0203927 A1 | 8/2011 | Draper et al. |
| 2011/0241244 A1 | 10/2011 | Liu |
| 2011/0256336 A1 | 10/2011 | Koike |
| 2012/0065300 A1 | 3/2012 | Shah et al. |
| 2012/0070667 A1 | 3/2012 | Malet et al. |
| 2012/0122020 A1 | 5/2012 | Hata et al. |
| 2012/0247800 A1 | 10/2012 | Shah et al. |
| 2012/0251432 A1 | 10/2012 | Cooper et al. |

FOREIGN PATENT DOCUMENTS

| | | |
|---|---|---|
| CN | 1379740 A | 11/2002 |
| CN | 1418260 A | 5/2003 |
| CN | 1477260 A | 2/2004 |
| CN | 1504407 A | 6/2004 |
| CN | 1558441 A | 12/2004 |
| CN | 1696337 A | 11/2005 |

(56) References Cited

FOREIGN PATENT DOCUMENTS

| | | |
|---|---|---|
| CN | 1826286 A | 8/2006 |
| CN | 1919727 A | 2/2007 |
| CN | 101012621 A | 8/2007 |
| CN | 101049927 | 10/2007 |
| CN | 101070250 A | 11/2007 |
| CN | 101095230 A | 12/2007 |
| CN | 101173386 A | 5/2008 |
| CN | 101177803 A | 5/2008 |
| CN | 101365830 A | 2/2009 |
| CN | 101372327 A | 2/2009 |
| CN | 101372329 | 2/2009 |
| CN | 101378988 | 3/2009 |
| CN | 101541860 A | 9/2009 |
| CN | 101698975 | 4/2010 |
| CN | 101746717 A | 6/2010 |
| EP | 098315 A1 | 1/1984 |
| EP | 1637828 A2 | 3/2006 |
| EP | 1939149 A2 | 7/2008 |
| GB | 2399092 A | 9/2004 |
| GB | 2458776 A | 10/2009 |
| GB | 2458776 A * | 10/2009 |
| IN | 01900DE2008 A | 3/2010 |
| JP | 60-027700 | 2/1985 |
| JP | 01-283376 A | 11/1989 |
| JP | H04-334823 A | 11/1992 |
| JP | 08-192044 A | 7/1996 |
| JP | 09-012343 | 1/1997 |
| JP | H11-139815 A | 5/1999 |
| JP | 2000-309870 A | 11/2000 |
| JP | 2002-115071 A | 4/2002 |
| JP | 2003-502507 A | 1/2003 |
| JP | 2003-171108 A | 6/2003 |
| JP | 2003-239171 A | 8/2003 |
| JP | 2004-015600 A | 1/2004 |
| JP | 2004-284919 A | 10/2004 |
| JP | 2004-327085 A | 11/2004 |
| JP | 2005-162571 A | 6/2005 |
| JP | 2005-213700 | 8/2005 |
| JP | 2006-026533 A | 2/2006 |
| JP | 2006-069816 A | 3/2006 |
| JP | 2006-255817 A | 9/2006 |
| JP | 2006-342011 | 12/2006 |
| JP | 2007-091556 A | 4/2007 |
| JP | 2007-117881 A | 5/2007 |
| JP | 2007-523033 A | 8/2007 |
| JP | 2007-523822 A | 8/2007 |
| JP | 2007-524774 A | 8/2007 |
| JP | 2008-063196 A | 3/2008 |
| JP | 2008-063718 A | 3/2008 |
| JP | 2008-535752 A | 9/2008 |
| JP | 2008-535763 A | 9/2008 |
| JP | 2008-266057 A | 11/2008 |
| JP | 2008-296338 A | 12/2008 |
| JP | 2009-021038 A | 1/2009 |
| JP | 2009-517531 A | 4/2009 |
| JP | 2009-535530 A | 10/2009 |
| JP | 2009-537439 A | 10/2009 |
| JP | 2011-071049 A | 4/2011 |
| KR | 100829001 | 5/2008 |
| TW | 200833861 | 8/2008 |
| TW | 201217827 A | 5/2012 |
| WO | WO-99/58756 | 11/1999 |
| WO | WO 01-39970 | 6/2001 |
| WO | WO 03-082733 | 10/2003 |
| WO | WO-2005/007564 A1 | 1/2005 |
| WO | WO-2005/012171 A2 | 2/2005 |
| WO | WO-2005037470 A2 | 4/2005 |
| WO | WO-2005075341 A2 | 8/2005 |
| WO | WO 2006-048531 | 5/2006 |
| WO | WO-2006/064760 A1 | 6/2006 |
| WO | WO-2006/107144 A1 | 10/2006 |
| WO | WO 2006-115486 | 11/2006 |
| WO | WO 2007-015710 | 2/2007 |
| WO | WO-2007020362 A2 | 2/2007 |
| WO | WO 2007-061854 | 5/2007 |
| WO | WO 2007-089118 | 8/2007 |
| WO | WO 2007-130979 | 11/2007 |
| WO | WO-2007/136755 A2 | 11/2007 |
| WO | WO-2007136613 A2 | 11/2007 |
| WO | WO 2007-149109 | 12/2007 |
| WO | WO-2008/025750 A1 | 3/2008 |
| WO | WO 2008-041183 | 4/2008 |
| WO | WO 2008-054541 | 5/2008 |
| WO | WO 2008-085634 | 7/2008 |
| WO | WO 2008-115640 | 9/2008 |
| WO | WO-2008/153609 A1 | 12/2008 |
| WO | WO 2009-004346 | 1/2009 |
| WO | WO-2009/008291 A1 | 1/2009 |
| WO | WO-2009/027133 A2 | 3/2009 |
| WO | WO 2009-110885 | 9/2009 |
| WO | WO 2010-087903 | 8/2010 |
| WO | WO-2010/129234 A2 | 11/2010 |

OTHER PUBLICATIONS

Aramid Fibers, DuPong Nemours, Inc. Apr. 30, 2001, http/www.chem.uwec.edu/Chem405_S01/malenirt/project.html, pp. 1-10.

Bradford, et al., "Electrical Conductivity Study of Carbon nanotube Yarns, 3-D Hybrid Braids and their Composites", Jouranl of Composite Materials, pp. 1533-1545, vol. 42, No. 15, SAGE Productions, Los Angeles, London, New Delhi and Singapore.

Bubert, et al., "Basic analytical investigation of plasma-chemically modified carbon fibers", Spectrochimica Acta Part B., 2002, pp. 1601-1610, vol. 57, Elsevier Science B.V.

Chae, et al., "A comparison of reinforcement efficiency of various types of carbon nanotubes in polyacrylonitrile fiber", Polymer, Nov. 21, 2005, pp. 10925-10935, vol. 46, No. 24, Elsevier Ltd.

Che, et al., "Chemical Vapor Deposition Based Synthesis of Carbon Nanotubes and Nanofibers Using a Template Method", Chem. Mater., 1998, pp. 260-267, vol. 10, American Chemical Society.

Chen, et al., "Basalt fiber-epoxy laminates with functionalized multi-walled carbon nanotubes", Composites, Part A, 2009, pp. 1082-1089, vol. 40, Elsevier Ltd.

Chen, et al., "Pulsed electrodeposition of Pt nanoclusters on carbon nanotubes modified carbon materials using diffusion restricting viscous electroyles", Electrochemistry Communications, Jun. 2007, pp. 1348-1354, vol. 9, Elsevier B.V.

Ci, et al., "Direct Growth of Carbon Nanotubes on the Surface of Ceramic Fibers", Carbon, 2005, pp. 883-886, vol. 43, No. 4, Elsevier Ltd.

Franz, et al., "Carbon Single-Wall Nanotube Growth in a Volumetrically Confined Arc Discharge System", U.S. Departement of Energy Journal of Undergraduate Research, pp. 66-69, publication date unknown.

Garcia, et al., "Aligned Carbon Nanotube Reinforcement of Advanced Composite Ply Interfaces," 49th AIAA/ASCE/AHS/ASC Structures, Structural Dynamics, and Materials Conference, Apr. 7-10, 2008, Schaumburg, IL, MIT, American Institute of Aeronautics and Astronautics, Inc.

Hsu, et al.. "Optical Absorption and Thermal Transport of Individual Suspended Carbon Nanotube Bundles", Nano Lett., 2009, pp. 590-594, vol. 9, No. 2, American Chemical Society, Publication Date (Web): Jan. 13, 2009.

Jiang, et al., "Carbon nanotube-coated solid-phase microextraction metal fiber based on sol-gel technique", Journal of Chromatography A., May 29, 2009, pp. 4641-4647, vol. 1216, Elsevier B.V.

Jiang, et al., "Plasma-Enhanced Deposition of Silver Nanoparticles onto Polymer and Metal Surfaces for the Generation of Antimicrobial Characteristics", Journal of Applied_Polymer Science, 2004, pp. 1411-1422, vol. 93, Wiley Periodicals, Inc.

Jung, et al., "Fabrication of radar absorbing structure (RAS) using GFFR-nano composite and spring-back compensation of hybrid composite RAS shells", Composite Structures, 2006, pp. 571-576, vol. 75, Elsevier Ltd.

Kim, et al., "Processing, characterization, and modeling of carbon nanotube-reinforced multiscale composites," Composites Science and Technology, 2009, pp. 335,342, vol. 69, Elsevier Ltd.

Kind, et al., "Patterned Films of Nanotubes Using Microcontact Printing of Catalysts", Adv. Mater., 1999, pp. 1285-1289, vol. 11, No. 15, Wiley-VCH Verlag GmbH, D-69469 Weinheim.

(56) References Cited

OTHER PUBLICATIONS

Kramer, et al., Constrained Iron Catalysts for Single-Walled Carbon Nanotube Growth?, Langmuir 2005, 21, 8466-8470 [http://pubs.acs.org/dol.abs/10.1021/1a0506729].

Laachachi, et al., "A chemical method to graft carbon nanotubes onto a carbon fiber", Materials Letters, 2008, pp. 394-397, vol. 62, Elsevier B.V.

Lee, "Syntheses and properties of fluorinated carbon materials", Journal of Fluorine Chemistry, 2007, pp. 392-403, vol. 128, Elsevier B.V.

Lee, et al., "Fabrication and design of multi-layered radar absorbing structures of MWNT-filled glass/epoxy plain-weave composites", Composite Structures, 2006, pp. 397-405, vol. 76, Elsevier Ltd.

Li, et al., "A Miniature glucose/$O_2$ biofuel cell with single-walled carbon nanotubes-modified carbon fiber microelectrodes as the substrate", Electrochemistry Communications, Jun. 2008, pp. 851-854, vol. 10, Elsevier B.V.

Li, et al., "Electromagnetic Interference (EMI) Shielding of Single-Walled Carbon Nanotube Epoxy Composites", Nano Lett., 2006, pp. 1141-1145, vol. 6, No. 6, American Chemical Society.

Lux, Rudolf, "PCT Application No. PCT/US2007/086875 Search Report and Written Opinion", May 13, 2008.

Makris, et al., "Carbon Nanotubes Growth and Anchorage to Carbon Fibres", Carbon Nanotubes, 2006, pp. 57-58, vol. 222, Springer, The Netherlands.

Meyyappan, et al., "Carbon nanotube growth by PECVD: a review", Plasma Sources Sci. Technol., 2003, pp. 205-216, vol. 12, IOP Publishing Ltd, UK.

Mylvaganam, "Fabrication and Application of Polymer Composites Comprising Carbon Nanotubes", Recent Pat Nanotechnol., 2007, pp. 59-65, vol. I, Bentham Science Publishers, Ltd.

Panhuis, et al.. "Carbon Nanotube Mediated Reduction in Optical Activity in Polyaniline Composite Materials", J. Phys. Chem. C, 2008, pp. 1441-1445, vol. 112, American Chemical Society.

Pisco, et al., "Hollow fibers integrated with single walled carbon nanotubes: Bandgap modification and chemical sensing capability", Sensors and Actuators B, 2008, pp. 163-170, vol. 129, Elsevier B.V.

Račkauskas "Carbon nanotube growth and use in energy sector", Energetika, 2006, pp. 43-46, vol. 2.

Satishkumar, et al., "Bundles of aligned carbon nanotubes obtained by the pyrolysis of ferrocene-hydrocarbon mixtures: role of the metal nanoparticles produced in situ", Chemical Physics Letters, 1999, pp. 158-162, vol. 307, Elsevier Science B.V.

Suh, et al., "Highly ordered two-dimensional carbon nanotube arrays", Applied Physics Letters, Oct. 4, 2002, pp. 2047-2049, vol. 75, No. 14, American Institute of Physics.

Thostenson, et al., "Carbon nanotube/carbon fiber hybrid multiscale composites", J. Appl. Phys., 2002, pp. 6034-6037, vol. 91, No. 9, American Institute of Physics.

U.S. Appl. No. 12/766,817, filed Apr. 23, 2010.

U.S. Appl. No. 61/295,621, filed Jan. 15, 2010.

U.S. Appl. No. 61/297,704, filed Jan. 22, 2010.

Wang, et al., "Penetration depth of atmospheric pressure plasma surface modification into multiple layers of polyester fabrics", Surface and Coatings Technology, 2007, pp. 77-83, vol. 202, Elsevier B.V.

Wang, et al., "Processing and property investigation of single-walled carbon nanotube (SWNT) buckypaper/epoxy resin matrix nanocomposites", Composites, Part A, 2004, pp. 1225-1232, vol. 35, Elsevier Ltd.

Wichmann, et al., "Glass-fibre-reinforced composites with enhanced mechanical and electrical properties—Benefits and limitations of a nanoparticle modified matrix", Engineering Fracture Mechanics, 2006, pp. 2346-2359, vol. 73, Elsevier Ltd.

Xu, et al., "Bone-Shaped Nanomaterials for Nanocomposite Applications", Nano Lett., 2003, pp. 1135-1139, vol. 3, No. 8, American Chemical Society.

Yabe, et al., Synthesis of well-aligned carbon nanotubes by radio frequency plasma enhanced CVD method, Diamond and Related Materials, 2004, pp. 1292-1295, vol. 13, Elsevier B.V.

Yanagishita, et al., "Carbon Nanotubes with a Triangular Cross-section, Fabricated Using Anodic Porous Alumina as the Temple", Adv. Mater., 204, pp. 429-432, vol. 16, No. 5, Wiley-VCH Verlag GmbH & Co. KGaA, Weinheim.

Yang, et al., "Electrical Conductivity and Electromagnetic Interference Shielding of Multi-walled Carbon Nanotube Filled Polymer Composites" Mater. Res. Soc. Symp. Proc., 2005, pp. HH5.3.1-HH.5.3.5, vol. 858E, Materials Research Society.

Yeh, et al., "Mechanical properties of phenolic-based nanocomposites reinforced by multi-walled carbon nanotubes and carbon fibers", Composites: Part A, 2008, pp. 677-684, vol. 39, No. 4.

Zhang, et al., "In situ growth of carbon nanotubes on inorganic fibers with different surface properties," Materials Chemistry and Physics, 2008, pp. 317-321, vol. 107, Science Direct.

Zhao, et al., "Growth of carbon nanotubes on the surface of carbon fibers", Carbon, 2007, pp. 380-383, vol. 46, No. 2, Elsevier Ltd.

Zhao, et al., "The growth of multi-walled carbon nanotubes with different morphologies on carbon fibers", Carbon, 2005, pp. 651-673, vol. 43, Elsevier Ltd.

Zhu, et al., "Carbon nanotube growth on carbon fibers", Diamond and Related Materials, 2003, pp. 1825-1825, vol. 12, Elsevier B.V.

Zhu, et al., "Synthesis of single-walled carbon nanotubes by the vertical floating catalyst method," Chinese Science Bulletin, 2002, pp. 159-162, vol. 47, No. 2.

Qu, et al., "Carbon Microfibers Sheathed with Aligned Carbon Nanotubes: Towards Multidimensional Multicomponent and Multifunctional Nanomaterials," Small, 2006, pp. 1052-1059, vol. 2, No. 8-9.

Zhang et al., "Integration and characterization of aligned carbon nanotubes on metal/silicon substrates and effects of water", Applied Surface Science 255 (2009) 5003-5008.

Mayya, et al., "Diameter Controlled Synthesis of Carbon Nanotubes by CVD Using Steric-Stabilized Nanoparticle Catalysts", NSTI-Nanotech, 2006, vol. 1, pp. 98-101.

Definition of nanoparticle provided by Dictionary.com, accessed Nov. 2, 2012, retrieved from <http://dictionary.reference.com/browse/nanoparticle>.

Zhong, et al., "Growth Kinetics of 0.5cm Vertically Aligned Single-Walled Carbon Nanotubes", The Journal of Physical Chemistry B (Letters), Feb. 6, 2007, pp. 1907-1910, vol. 111, No. 8.

Emmenegger, et al., "Carbon Nanotube Synthesized on Metallic Substrate," Applied Surface Science, 2000, pp. 452-456.

Hart, et al., "Desktop Growth of Carbon-Nanotube Monoliths with in Situ Optical Imaging," Small, 2007, pp. 772-777, vol. 3, No. 5.

Hasegawa, et al., "Millimeter-Tall Single-Walled Carbon Nanotubes Rapidly Grown with and without Water," ACS Nano, 2011, pp. 975-984, vol. 5, No. 2.

Medalia, et al., "Redox Recipes. I. Reaction between Ferrous Iron and Peroxides. General Considerations," Journal of Polymer Science, 1949, p. 377-398, vol. IV.

Hart, et al., "Growth of conformal single-walled carbon nanotube films from MO/Fe/$AL_2O_3$ deposited by electron beam evaporation," Carbon (2006) vol. 44, pp. 348-359.

\* cited by examiner

US 8,815,341 B2

CARBON FIBER SUBSTRATES HAVING CARBON NANOTUBES GROWN THEREON AND PROCESSES FOR PRODUCTION THEREOF

CROSS-REFERENCE TO RELATED APPLICATIONS

This application claims the benefit of priority under 35 U.S.C. §119 from U.S. Provisional Patent Application Ser. No. 61/385,532, filed Sep. 22, 2010, which is incorporated herein by reference in its entirety. This application is also related to U.S. patent application Ser. No. 12/611,101, filed Nov. 2, 2009, which is also incorporated herein by reference in its entirety.

STATEMENT REGARDING FEDERALLY SPONSORED RESEARCH OR DEVELOPMENT

Not applicable.

FIELD OF THE INVENTION

The present invention generally relates to carbon nanotubes, and, more specifically, to carbon nanotube growth.

BACKGROUND

Carbon nanotubes have been proposed to have utility in a number of applications due to their large effective surface area, mechanical strength, and thermal and electrical conductivity, among other properties. Many of these applications are particularly well suited for carbon nanotubes that have been grown on carbon fiber substrates. When grown on carbon fiber substrates, the properties of the carbon fiber substrates can be enhanced by the carbon nanotubes. For example, when carbon nanotubes are grown thereon, the mechanical strength of the carbon fiber substrates can be enhanced, and the carbon fiber substrates can become electrically conductive.

In order to synthesize carbon nanotubes, a catalyst is generally needed to mediate carbon nanotube growth. Most often, the catalyst is a metal nanoparticle, particularly a zero-valent transition metal nanoparticle. A number of processes for synthesizing carbon nanotubes are known in the art including, for example, micro-cavity, thermal- or plasma-enhanced chemical vapor deposition (CVD) techniques, laser ablation, arc discharge, flame synthesis, and high pressure carbon monoxide (HiPCO) techniques. Generally, such processes for synthesizing carbon nanotubes can involve generating reactive gas phase carbon species under conditions suitable for carbon nanotube growth.

Synthesis of carbon nanotubes on solid substrates can be carried out using many of these techniques. However, it is considered very difficult in the art to grow carbon nanotubes on carbon fiber substrates. It is believed that a primary impediment to this effort has been the difficulty of dissolving sufficiently high quantities of the reactive gas phase carbon species in metal nanoparticle catalysts to support carbon nanotube growth. Unlike other types of substrates (e.g., metals, glass and the like), carbon fiber substrates and the reactive gas phase carbon species are both composed of carbon, which greatly increases their interaction with one another and makes the reactive carbon species less likely to dissolve in the metal nanoparticles to facilitate carbon nanotube growth. In addition, unfavorable interactions between metal nanoparticles and carbon fiber substrates can further limit the ability of reactive gas phase carbon species to diffuse into the metal nanoparticles, further impeding carbon nanotube growth.

In view of the foregoing, reliable processes for growing carbon nanotubes on carbon fiber substrates would be of substantial benefit in the art. The present disclosure satisfies this need and provides related advantages as well.

SUMMARY

In some embodiments, carbon nanotube growth processes described herein include depositing a catalyst precursor on a carbon fiber substrate; depositing a non-catalytic material on the carbon fiber substrate; and after depositing the catalyst precursor and the non-catalytic material, exposing the carbon fiber substrate to carbon nanotube growth conditions so as to grow carbon nanotubes thereon. The carbon nanotube growth conditions convert the catalyst precursor into a catalyst that is operable for growing carbon nanotubes.

In some embodiments, carbon nanotube growth processes described herein include depositing a catalyst precursor on a carbon fiber substrate that is free of a sizing agent; depositing a non-catalytic material on the carbon fiber substrate; after depositing the catalyst precursor and the non-catalytic material, exposing the carbon fiber substrate to carbon nanotube growth conditions so as to grow carbon nanotubes thereon; and transporting the carbon fiber substrate while the carbon nanotubes are being grown. The non-catalytic material is deposited prior to, after or concurrently with the catalyst precursor. The carbon nanotube growth conditions convert the catalyst precursor into a catalyst that is operable for growing carbon nanotubes.

In some embodiments, carbon nanotube growth processes described herein include providing a carbon fiber substrate that is free of a sizing agent and has a barrier coating deposited thereon; depositing a catalyst precursor on the barrier coating; after depositing the catalyst precursor, exposing the carbon fiber substrate to carbon nanotube growth conditions so as to grow carbon nanotubes thereon; and transporting the carbon fiber substrate while the carbon nanotubes are being grown. The barrier coating is selected from the group consisting of an alkoxysilane, an alkylsiloxane, an alumoxane, alumina nanoparticles, spin on glass, glass nanoparticles, and combinations thereof. The carbon nanotube growth conditions convert the catalyst precursor into a catalyst that is operable for growing carbon nanotubes.

In some embodiments, carbon fiber substrates having carbon nanotubes grown thereon by the present carbon nanotube growth processes are described herein.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1A:
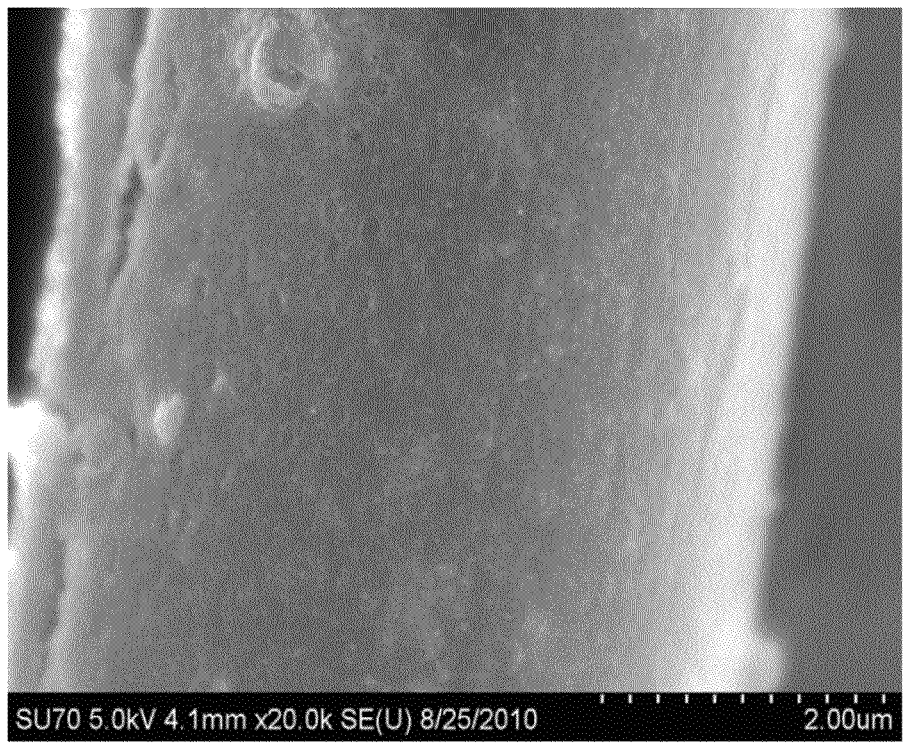
FIGS. 1A and 1B show illustrative SEM images of a carbon fiber substrate coated with an iron acetate catalyst precursor deposited concurrently with a non-catalytic aluminum nitrate material upon an intermediate layer of non-catalytic glass material.

The present disclosure is directed, in part, to processes for growing carbon nanotubes on carbon fiber substrates. The present disclosure is also directed, in part, to carbon fiber substrates having carbon nanotubes grown thereon that are produced by the present carbon nanotube growth processes.

Carbon nanotubes have demonstrated utility in a number of applications that take advantage of their unique structure and properties including, for example, large surface area, mechanical strength, electrical conductivity, and thermal conductivity. When grown on a carbon fiber substrate, carbon nanotubes and the carbon fiber substrate form a composite architecture that advantageously allows the beneficial properties of the carbon nanotubes to be imparted to the carbon fiber substrate. Among the applications in which such carbon fibers can be used include, for example, composite materials, batteries, supercapacitors, and the like.

In spite of the potential benefits that can be realized by growing carbon nanotubes on carbon fiber substrates, such growth has proven particularly difficult in the art. As previously noted, and without being bound by theory or mechanism, it is believed that this difficulty can arise due to unfavorable interactions between a reactive gas phase carbon species and a carbon fiber substrate or between metal nanoparticles and a carbon fiber substrate. The unfavorable substrate interactions can make the reactive gas phase carbon species unavailable for carbon nanotube growth, or the growth rate can be severely limited. Such slow growth rates can be unsuitable for commercial production of carbon nanotubes on carbon fiber substrates, particularly in cases where the carbon fiber substrates are transported during carbon nanotube growth to facilitate throughput.

In order to support the rapid growth rates needed for high throughput synthesis of carbon nanotubes on carbon fiber substrates, it has been discovered that interactions with the carbon fiber substrate can be significantly reduced by using a non-catalytic material and/or an optional barrier coating in conjunction with the catalytic material. Further, it has been discovered that an active catalyst can be formed in situ from simple metal salt catalyst precursors during exposure to carbon nanotube growth conditions.

In some embodiments, carbon nanotubes grown on a carbon fiber substrate can be chemically or mechanically adhered to the carbon fiber substrate. Carbon nanotubes grown on a carbon fiber substrate by the present processes (i.e., infused carbon nanotubes) can be more strongly adhered to the carbon fiber substrate than would pre-synthesized carbon nanotubes held in place by simple van der Waals physiosorption interactions. Hence, the present carbon fiber substrates having carbon nanotubes grown thereon are distinguished from carbon fiber substrates having had pre-formed carbon nanotubes deposited thereon (e.g., from a carbon nanotube solution or suspension). In some embodiments, the carbon nanotubes can be directly bonded to the carbon fiber substrate (e.g., by a covalent bond). In other embodiments, the carbon nanotubes can be indirectly bonded to the carbon fiber substrate via a catalytic material used to mediate the carbon nanotubes' synthesis and/or via a non-catalytic material deposited on the carbon fiber substrate. In some embodiments, the carbon nanotubes can be indirectly bonded to the carbon fiber substrate via a barrier coating.

As used herein, the term "infused" refers to being bonded, and "infusion" refers to the process of bonding. As used herein, the term "carbon nanotube-infused fiber" refers to a fiber material that has carbon nanotubes bonded thereto. Such bonding of carbon nanotubes to a fiber material can involve mechanical attachment, covalent bonding, ionic bonding, pi-pi interactions (pi-stacking interactions), and/or van der Waals force-mediated physisorption.

As used herein, the term "catalyst" refers to a substance that is operable to form carbon nanotubes when exposed to carbon nanotube growth conditions.

As used herein, the term "catalytic material" refers to catalysts and catalyst precursors. As used herein, the term "catalyst precursor" refers to a substance that can be transformed into a catalyst under appropriate conditions, particularly carbon nanotube growth conditions. Unless otherwise specifically set forth herein, the term "catalytic material" will be used to indicate that either a pre-formed catalyst or a catalyst precursor can be used in the described embodiment.

As used herein, the term "nanoparticle" refers to particles having a diameter between about 0.1 nm and about 100 nm in equivalent spherical diameter, although nanoparticles need not necessarily be spherical in shape. As used herein, the term "catalytic nanoparticle" refers to a nanoparticle that possesses catalytic activity for mediating carbon nanotube growth.

As used herein, the term "transition metal" refers to any element or alloy of elements in the d-block of the periodic table (Groups 3 through 12), and the term "transition metal salt" refers to any transition metal compound such as, for example, transition metal oxides, nitrates, chlorides, bromides, iodides, fluorides, acetates, citrates, carbides, nitrides, and the like. Illustrative transition metals that can form catalytic nanoparticles suitable for synthesizing carbon nanotubes include, for example, Ni, Fe, Co, Mo, Cu, Pt, Au, Ag, alloys thereof, salts thereof, and mixtures thereof.

As used herein, the terms "spoolable lengths" or "spoolable dimensions" equivalently refer to a material that has at least one dimension that is not limited in length, thereby allowing the material to be stored on a spool or mandrel, for example, in a reel-to-reel process. A material of "spoolable lengths" or "spoolable dimensions" has at least one dimension that allows the growth of carbon nanotubes thereon while the material is being transported. However, a material of spoolable lengths can also have carbon nanotubes grown thereon in a batchwise manner, if desired.

As used herein, the term "carbon nanotube growth conditions" refers to any process that is capable of growing carbon nanotubes in the presence of a suitable catalyst. Generally, carbon nanotube growth conditions generate a reactive carbon species, oftentimes by the pyrolysis of an organic compound.

As used herein, the terms "convey" and "conveying" will be understood to be synonymous with the terms "moving" and/or "transporting".

As used herein, the term "sizing agent" collectively refers to materials used in the manufacture of fiber materials as a coating to protect the integrity of the fiber material. Most often in the case of carbon fiber materials, the sizing agent is an epoxy.

In some embodiments, carbon nanotube growth processes described herein can include depositing a catalyst precursor on a carbon fiber substrate; depositing a non-catalytic material on the carbon fiber substrate; and after depositing the catalyst precursor and the non-catalytic material, exposing the carbon fiber substrate to carbon nanotube growth conditions so as to grow carbon nanotubes thereon. The carbon nanotube growth conditions can convert the catalyst precursor into a catalyst that is operable for growing carbon nanotubes.

In some embodiments, carbon nanotube growth processes described herein can include depositing a catalyst precursor on a carbon fiber substrate that is free of a sizing agent; depositing a non-catalytic material on the carbon fiber substrate; after depositing the catalyst precursor and the non-catalytic material, exposing the carbon fiber substrate to carbon nanotube growth conditions so as to grow carbon nanotubes thereon; and transporting the carbon fiber substrate while the carbon nanotubes are being grown. The non-catalytic material can be deposited prior to, after, or concurrently with the catalyst precursor. The carbon nanotube growth conditions can convert the catalyst precursor into a catalyst that is operable for growing carbon nanotubes.

In some embodiments, carbon nanotube growth processes described herein can include providing a carbon fiber substrate that is free of a sizing agent and has a barrier coating deposited thereon; depositing a catalyst precursor on the barrier coating; after depositing the catalyst precursor, exposing the carbon fiber substrate to carbon nanotube growth conditions so as to grow carbon nanotubes thereon; and transporting the carbon fiber substrate while the carbon nanotubes are being grown. The barrier coating can be selected from the group consisting of an alkoxysilane, an alkylsiloxane, an alumoxane, alumina nanoparticles, spin on glass, glass nanoparticles, and combinations thereof. The carbon nanotube growth conditions can convert the catalyst precursor into a catalyst that is operable for growing carbon nanotubes.

The form of the carbon fiber substrate can vary without limitation in the present embodiments. In some embodiments, the carbon fiber substrate can be a continuous carbon fiber substrate such that the carbon fiber substrate can be compatible with being transported during carbon nanotube growth (e.g., in a reel-to-reel process). A suitable carbon fiber substrate form that can be transported during carbon nanotube growth can include, for example, individual carbon filaments or various carbon fiber forms that are made from individual carbon filaments. In some embodiments, the carbon fiber substrate can be in non-limiting forms such as, for example, carbon fiber filaments, carbon fiber rovings, carbon fiber yarns, carbon fiber tows, carbon fiber tapes, carbon fiber ribbons, carbon fiber meshes, carbon fiber tubes, carbon fiber films, carbon fiber braids, woven carbon fiber fabrics, non-woven carbon fiber fabrics, carbon fiber plies, carbon fiber mats, and the like. Higher order fiber forms such as, for example, woven and non-woven carbon fiber fabrics, carbon fiber plies, and carbon fiber meshes can be formed from lower order carbon fiber substrates such as, for example, carbon filaments, carbon fibers and carbon fiber tows. That is, carbon fibers, carbon filaments, or carbon fiber tows can have carbon nanotubes grown thereon, with formation of the higher order fiber forms taking place thereafter. In other embodiments, such higher order fiber forms can be pre-manufactured, with growth of carbon nanotubes thereon taking place afterward. As used herein, the foregoing carbon fiber forms will be collectively referred to as carbon fiber substrates, unless specifically noted otherwise.

Filaments include high aspect ratio fibers having diameters generally ranging in size between about 1 μm and about 100 μm. Rovings include soft strands of fiber that have been twisted, attenuated and freed of foreign matter.

Yarns include closely associated bundles of twisted filaments, wherein each filament diameter in the yarn is relatively uniform. Yarns have varying weights described by their 'tex,' (expressed as weight in grams per 1000 linear meters), or 'denier' (expressed as weight in pounds per 10,000 yards). For yarns, a typical tex range is usually between about 200 and about 2000.

Fiber braids represent rope-like structures of densely packed fibers. Such rope-like structures can be assembled from yarns, for example. Braided structures can include a hollow portion. Alternately, a braided structure can be assembled about another core material.

Fiber tows include associated bundles of untwisted filaments. As in yarns, filament diameter in a fiber tow is generally uniform. Fiber tows also have varying weights and a tex range that is usually between about 200 and about 2000. In addition, fiber tows are frequently characterized by the number of thousands of filaments in the fiber tow, such as, for example, a 12K tow, a 24K tow, a 48K tow, and the like.

Tapes are fiber materials that can be assembled as weaves or as non-woven flattened fiber tows, for example. Tapes can vary in width and are generally two-sided structures similar to a ribbon. In the various embodiments described herein, carbon nanotubes can be grown on a tape on one or both sides of the tape. In addition, carbon nanotubes of different types, diameters or lengths can be grown on each side of a tape, which can be advantageous in certain applications.

In some embodiments, fiber materials can be organized into fabric or sheet-like structures. These can include, for example, woven fabrics, non-woven fiber mats, meshes and fiber plies, in addition to the tapes described above.

Although any type of carbon fiber can be used in the present processes, there are three types of carbon fibers that are commonly used in the art. These are categorized based on the precursors used to generate the fibers: Rayon, polyacrylonitrile (PAN) and pitch. Carbon fibers from rayon precursors, which are cellulosic materials, have a relatively low carbon content of about 20%, and the fibers tend to have a low strength and stiffness. In contrast, PAN precursors provide carbon fibers having a carbon content of about 55% and an excellent tensile strength due to a minimum of surface defects. Pitch precursors based on petroleum asphalt, coal tar, and polyvinyl chloride can also be used to produce carbon fibers. Although pitches are relatively low in cost and high in carbon yield, there can be issues of non-uniformity within a given batch of carbon fibers.

The types of carbon nanotubes grown on the carbon fiber substrates can generally vary without limitation. In various embodiments, the carbon nanotubes grown on the carbon fiber substrates can be, for example, any of a number of cylindrically-shaped carbon allotropes of the fullerene family including, for example, single-wall carbon nanotubes, double-wall carbon nanotubes, multi-wall carbon nanotubes, and any combination thereof. One of ordinary skill in the art will recognize that the types of carbon nanotubes grown on the carbon fiber substrate can be varied by adjusting the carbon nanotube growth conditions. In some embodiments, the carbon nanotubes can be capped with a fullerene-like structure. That is, the carbon nanotubes can have closed ends in such embodiments. However, in other embodiments, the carbon nanotubes can remain open-ended. In some embodiments, closed carbon nanotube ends can be opened through treatment with an appropriate oxidizing agent (e.g., $HNO_3$/$H_2SO_4$). In some embodiments, the carbon nanotubes can encapsulate other materials after being grown on the carbon fiber substrate. In some embodiments, the carbon nanotubes can be covalently functionalized after being grown on the carbon fiber substrate. In some embodiments, a plasma process can be used to promote functionalization of the carbon nanotubes.

Carbon nanotubes can be metallic, semimetallic or semiconducting depending on their chirality. An established system of nomenclature for designating a carbon nanotube's chirality is recognized by those having ordinary skill in the art and is distinguished by a double index (n,m), where n and m are integers that describe the cut and wrapping of hexagonal graphite when formed into a tubular structure. In various embodiments, carbon nanotubes grown on carbon fiber substrates according to the present embodiments can be of any specified chirality or mixture of chiral forms.

In addition to chirality, a carbon nanotube's diameter also influences its electrical conductivity and the related property of thermal conductivity. In the synthesis of carbon nanotubes, a carbon nanotube's diameter can be controlled by using catalytic nanoparticles of a given size. Typically, a carbon nanotube's diameter is approximately that of the catalytic nanoparticle that catalyzes its formation. Therefore, a carbon nanotube's properties can be controlled in one respect by adjusting the size of the catalytic nanoparticle used for its synthesis, for example. By way of non-limiting example, catalytic nanoparticles having a diameter of about 1 nm to about 5 nm can be used to grow predominantly single-wall carbon nanotubes. Larger catalytic nanoparticles can be used to prepare predominantly multi-wall carbon nanotubes, which have larger diameters because of their multiple nanotube layers. Mixtures of single-wall and multi-wall carbon nanotubes can also be grown by using larger catalytic nanoparticles in the carbon nanotube synthesis. Catalytic nanoparticles of a desired size can also be purchased from various commercial sources, or they can be prepared in situ from a catalyst precursor according to the present embodiments. In some embodiments, nanoparticulate catalyst precursors can be prepared in situ from an aqueous solution containing a transition metal salt and hydrogen peroxide.

In various embodiments herein, the diameter of the carbon nanotubes grown on a carbon fiber substrate can range between about 1 nm and about 500 nm, including all values and subranges in between. In some embodiments, the diameter of the carbon nanotubes can range between about 1 nm and about 10 nm. In other embodiments, the diameter of the carbon nanotubes can range between about 1 nm and about 30 nm, or between about 5 nm and about 30 nm, or between about 15 nm and about 30 nm. In some embodiments, the diameter of the carbon nanotubes can range between about 10 nm and about 50 nm or between about 50 nm and about 100 nm. In other embodiments, the diameter of the carbon nanotubes can range between about 100 nm and about 300 nm or between about 300 nm and about 500 nm. Generally, larger carbon nanotubes can be formed at higher loadings of the catalytic material, where nanoparticle agglomeration can lead to larger carbon nanotube diameters. At lower loadings of the catalytic material, the carbon nanotube diameters can be less sensitive to agglomeration effects, and the carbon nanotube diameters generally can typically range between about 1 nm and about 50 nm, for example.

In some embodiments, an average length of the carbon nanotubes grown on a carbon fiber substrate can range between about 1 μm and about 1000 μm, including all values and subranges in between. In some embodiments, an average length of the carbon nanotubes can be less than about 1 μm, including about 0.5 μm, for example. In some embodiments, an average length of the carbon nanotubes can be between about 1 μm and about 10 μm, including all values and subranges therebetween. In still other embodiments, an average length of the carbon nanotubes can be greater than about 500 μm. Generally, higher loadings of the catalytic material in the present embodiments can favor greater carbon nanotube growth rates and longer carbon nanotubes. In some embodiments, carbon nanotube growth rates of up to 1.3 μm/second can be realized.

In some embodiments, the carbon nanotubes grown on the carbon fiber substrate can be present as individual carbon nanotubes. That is, the carbon nanotubes can be present in a substantially non-bundled state. In some embodiments, the carbon nanotubes grown on the carbon fiber substrate can be present as a carbon nanostructure containing interlinked carbon nanotubes. In such embodiments, substantially non-bundled carbon nanotubes can be present as an interlinked network of carbon nanotubes. In some embodiments, the interlinked network can contain carbon nanotubes that branch in a dendrimeric fashion from other carbon nanotubes. In some embodiments, the interlinked network can also contain carbon nanotubes that bridge between carbon nanotubes. In some embodiments, the interlinked network can also contain carbon nanotubes that have a least a portion of their sidewalls shared with other carbon nanotubes.

In some embodiments, graphene or other carbon nanomaterials can be grown on a carbon fiber substrate by appropriate modifications to the growth conditions. Such modifications will be evident to one having ordinary skill in the art. It should be recognized that any embodiments herein specifically referencing carbon nanotubes can also utilize graphene or other carbon nanomaterials while still residing within the spirit and scope of the present disclosure.

In various embodiments, the catalytic material of the present processes can be a catalyst or a catalyst precursor. That is, the catalytic material can be an active catalyst that can directly catalyze the formation of carbon nanotubes in some embodiments. For example, the catalytic material can be catalytic nanoparticles (e.g., transition metal nanoparticles or lanthanide metal nanoparticles) that can directly catalyze the formation of carbon nanotubes without further transformation being needed. In other embodiments, the catalytic material can be a catalyst precursor that is initially catalytically inactive but can be converted through one or more chemical transformations into an active catalyst. Such conversion to an active catalyst can occur prior to and/or during exposure of the carbon fiber substrate to carbon nanotube growth conditions. According to some embodiments, a catalyst precursor can be converted into an active catalyst without exposure to a discrete reduction step (e.g., $H_2$) prior to being exposed to suitable carbon nanotube growth conditions. In some embodiments, the catalyst precursor can attain an intermediate catalyst state (e.g., a metal oxide) prior to being converted into an active catalyst upon exposure to suitable carbon nanotube growth conditions. For example, a transition metal salt can be converted into a transition metal oxide that is subsequently converted into an active catalyst upon exposure to carbon nanotube growth conditions. In some embodiments, the formation of the intermediate catalyst state can occur as a result of active heating of the carbon fiber substrate prior to and/or during exposure to carbon nanotube growth conditions.

In various embodiments, the catalytic material can be a transition metal, a transition metal alloy, a transition metal salt, or a combination thereof. In some embodiments, the catalytic material can be in the form of catalytic nanoparticles. In other embodiments, the catalytic material can be in the form of a catalyst precursor. In some embodiments, the catalyst precursor can be a transition metal salt or a combination of transition metal salts such as, for example, a transition metal nitrate, a transition metal acetate, a transition metal citrate, a transition metal chloride, a transition metal fluoride, a transition metal bromide, a transition metal iodide, or hydrates thereof. In some embodiments, such transition metal salts can be transformed into a transition metal oxide upon heating, with conversion to an active catalyst taking place thereafter. In alternative embodiments, transition metal carbides, transition metal nitrides, or transition metal oxides can be used as the catalytic material. Illustrative transition metal salts that can be suitable for practicing the present processes can include, for example, iron (II) nitrate, iron (III) nitrate, cobalt (II) nitrate, nickel (II) nitrate, copper (II) nitrate, iron (II) acetate, iron (III) acetate, cobalt (II) acetate, nickel (II) acetate, copper (II) acetate, iron (II) citrate, iron (III) citrate, iron (III) ammonium citrate, cobalt (II) citrate, nickel (II) citrate, copper (II) citrate, iron (II) chloride, iron (III) chloride, cobalt (II) chloride, nickel (II) chloride, copper (II) chloride, hydrates thereof, and combinations thereof. In some embodiments, a suitable catalyst precursor can be iron (II) acetate or a hydrate thereof. In alternative embodiments, the catalytic material can include substances such as, for example, $FeO$, $Fe_2O_3$, $Fe_3O_4$, and combinations thereof, any of which can be in the form of nanoparticles. In still further embodiments, lanthanide metal salts, their hydrates, and combinations thereof can be used as a catalyst precursor.

In embodiments in which an intermediate catalyst state has been formed from a catalyst precursor, the intermediate catalyst state can be converted into an active catalyst (e.g., catalytic nanoparticles) without a separate catalyst activation step being conducted prior to exposure of the carbon fiber substrate to carbon nanotube growth conditions. In contrast, it has been conventional in the art to activate carbon nanotube catalysts with hydrogen in a separate step before proceeding with carbon nanotube growth. In the present embodiments, formation of an active catalyst can take place upon exposure of the intermediate catalyst state to carbon nanotube growth conditions. For example, during the synthesis of carbon nanotubes, pyrolysis of acetylene in a carbon nanotube growth reactor results in the formation of hydrogen gas and atomic carbon. The hydrogen gas can react with a transition metal oxide or like intermediate catalyst state to produce zerovalent transition metal catalytic nanoparticles that coat the carbon fiber substrate. This can particularly be the case for a carbon fiber substrate that is being actively heated. Formation of a metal carbide thereafter and ensuing diffusion of carbon vapor into the catalyst particles can result in the formation of carbon nanotubes on the carbon fiber substrate.

In some embodiments, a non-catalytic material can also be used in the present processes in conjunction with the catalytic material. Although carbon nanotubes can be grown on carbon fiber substrates according to the present processes even without a non-catalytic material being present, use of a non-catalytic material in conjunction with the catalytic material can result in improved carbon nanotube growth rates and better carbon nanotube coverage. Without being bound by theory or mechanism, it is believed that the non-catalytic material can limit interactions of the catalytic material with the carbon fiber substrate that can otherwise inhibit carbon nanotube growth. Further, it is also believed that the non-catalytic material can facilitate the dissociation of a catalyst precursor into an active catalyst and promote the anchoring of carbon nanotubes to the carbon fiber substrate.

In some embodiments, the use of a non-catalytic material in conjunction with a catalyst precursor can enable the growth of carbon nanotubes on a carbon fiber substrate without a separate operation being used to convert the catalyst precursor into an active catalyst suitable for carbon nanotube growth. That is, in some embodiments, a catalyst precursor can be used in conjunction with a non-catalytic material to directly grow carbon nanotubes on a carbon fiber substrate upon exposure to carbon nanotube growth conditions. In some embodiments, formation of an active catalyst from a catalyst precursor can involve the formation of an intermediate catalyst state (e.g., a transition metal oxide). In some embodiments, the intermediate catalyst state can be formed by heating the catalyst precursor to its decomposition temperature such that a metal oxide (e.g., a transition metal oxide) is formed. In some embodiments, the present processes can include forming catalytic nanoparticles from a catalyst precursor while the carbon fiber substrate is being exposed to carbon nanotube growth conditions, optionally while the carbon fiber substrate is being transported. In alternative embodiments, the present processes can include forming catalytic nanoparticles from a catalyst precursor or intermediate catalyst state prior to exposing the carbon fiber substrate to carbon nanotube growth conditions. For example, a separate catalyst activation step can be conducted, if desired, such as by exposing the catalyst precursor or intermediate catalyst state to hydrogen. In some embodiments, the catalyst precursor or intermediate catalyst state can be deposited or formed on the carbon fiber substrate, and the carbon fiber substrate can then be stored for later use. That is, the carbon fiber substrate can be loaded with a catalyst precursor or intermediate catalyst state and then exposed to carbon nanotube growth conditions at a later time.

Non-catalytic materials that can be suitable for practicing the present processes are generally substances that are inert to carbon nanotube growth conditions. As described above, such non-catalytic materials can be further operable to stabilize the catalytic material, thereby facilitating carbon nanotube growth. In some embodiments, the non-catalytic material can be an aluminum-containing compound, a silicon-containing compound, or a combination thereof. Illustrative aluminum-containing compounds can include aluminum salts (e.g., aluminum nitrate and/or aluminum acetate) or hydrates thereof. Illustrative silicon-containing compounds can include glasses and like silicon dioxide formulations, silicates and silanes.

When a non-catalytic material is used in the present processes, the catalytic material can be deposited prior to, after, or concurrently with the catalytic material. In some embodiments, the catalytic material can be deposited prior to the non-catalytic material. That is, in such embodiments, the catalytic material can be deposited between the carbon fiber substrate and the non-catalytic material. In other embodiments, the catalytic material can be deposited after the non-catalytic material. That is, in such embodiments, the non-catalytic material can be deposited between the carbon fiber substrate and the catalytic material. In still other embodiments, the catalytic material can be deposited concurrently with the non-catalytic material. Regardless of the deposition sequence, the combination of the catalytic material and the non-catalytic material can form a catalyst coating on the carbon fiber substrate. In some embodiments, the catalyst coating can have a thickness ranging between about 5 nm and about 100 nm. In other embodiments, the catalyst coating can have a thickness ranging between about 10 nm and about 100 nm or between about 10 nm and about 50 nm.

In some embodiments, a catalyst precursor can be used in conjunction with a barrier coating. In some embodiments, a catalyst precursor can be used in conjunction with a non-catalytic material and a barrier coating. Use of a barrier coating in conjunction with the infusion of carbon nanotubes to carbon fibers is described in commonly owned U.S. patent application Ser. No. 12/611,101, filed Nov. 2, 2009, which was previously incorporated herein by reference. In some embodiments, the barrier coating can be conformally disposed about the carbon fiber substrate. In some embodiments, the barrier coating can allow indirect infusion of the carbon nanotubes to the carbon fiber substrate. That is, in such embodiments, the carbon nanotubes can be grown from a barrier coating on the carbon fiber substrate. In some embodiments, the barrier coating can limit interaction of the catalyst, once formed from a catalyst precursor, with the carbon fiber substrate. In addition, the barrier coating can serve as a thermal barrier that can inhibit heat degradation of the carbon fiber substrate, as well as limit the interaction of carbon vapor with the carbon fiber substrate.

Illustrative barrier coatings can include, for example, alkoxysilanes, alkylsiloxanes, alumoxanes, alumina nanoparticles, spin on glass and glass nanoparticles. For example, in an embodiment, the barrier coating can be Accuglass T-11 Spin-On Glass (Honeywell International Inc., Morristown, NJ). In some embodiments, the barrier coating can be disposed about the carbon fiber substrate before either the catalytic material and/or the non-catalytic material. In other embodiments, the non-catalytic material can be deposited on the barrier coating. In still other embodiments, the catalytic material can be combined with an uncured barrier coating and applied to the fiber material together, with curing taking place thereafter. In some embodiments, the non-catalytic material can also be combined with the barrier coating, or the non-catalytic material can be deposited on a barrier coating that also contains the catalytic material. In some embodiments, the barrier coating, the catalytic material and the non-catalytic material can all be combined together. In some embodiments, the barrier coating can be sufficiently thin to allow exposure of the catalyst or catalyst precursor to a carbon feedstock gas during carbon nanotube growth. In some embodiments, the thickness of the barrier coating can be less than or about equal to the effective diameter of catalytic nanoparticles that are used to mediate carbon nanotube growth.

In some embodiments, the thickness of the barrier coating can range between about 10 nm and about 100 nm. In other embodiments, the thickness of the barrier coating can range between about 10 nm and about 50 nm. In still other embodiments, the thickness of the barrier coating can be less than about 10 nm.

Without being bound by theory, the barrier coating can serve as an intermediate layer between the carbon fiber substrate and the carbon nanotubes so as to facilitate their adhesion to one another. When grown on a carbon fiber substrate using a barrier coating, the beneficial properties of the carbon nanotubes can still be conveyed to the carbon fiber substrate, while providing a robust platform for organizing and adhering the carbon nanotubes to the substrate.

In general, the barrier coating and the non-catalytic material can both utilize substances that bear some chemical similarity to one another. In some embodiments, the barrier coating can be a substance that is not the same as the non-catalytic material. For example, in some embodiments, the barrier coating can be chosen from substances such as, for example, an alkoxysilane, an alkylsiloxane, an alumoxane, alumina nanoparticles, spin on glass, and glass nanoparticles, and the non-catalytic material can be a metal salt. In some embodiments, the non-catalytic material used in combination with a barrier coating can be an aluminum salt or a hydrate thereof. In more specific embodiments, the aluminum salt used as the non-catalytic material can be aluminum nitrate or a hydrate thereof.

Carbon fiber substrates are typically produced commercially with a sizing agent coating the fibers. Although a wide range of sizing agents are used on commercial fibers, most often epoxy resin sizing agents are used in association with carbon fibers. It has been discovered in conjunction with the present disclosure that the presence of a sizing agent can be detrimental to the growth of carbon nanotubes on carbon fiber substrates. More specifically, the epoxy resin sizing agents most commonly used in association with carbon fiber substrates can prevent the individual carbon filaments in a carbon fiber tow or like fiber structure from being adequately spread prior to growing carbon nanotubes thereon. When the carbon fiber substrate is unable to be adequately spread, it can sometimes be the case that a catalytic material can incompletely coat the carbon fiber substrate, such that poor carbon nanotube growth is seen. However, if the sizing agent is removed before carbon nanotube growth takes place, the carbon fibers can be easily spread, and the catalytic material can be readily applied thereto. Therefore, removing a sizing agent from the carbon fiber substrate, spreading the carbon fiber substrate and applying a catalytic material to the carbon fiber substrate can improve the carbon nanotube coverage thereon. Without being bound by theory or mechanism, it is believed that epoxy resin sizing agents can be detrimental to carbon nanotube growth not only because they can result in poor coverage of a catalytic material on the carbon fiber substrate, but also because epoxy resins are generally a poor surface upon which to grow carbon nanotubes.

In some embodiments, the present processes can further include removing a sizing agent from the carbon fiber substrate (e.g., by heating). In other embodiments, the carbon fiber substrate can be obtained or produced such that it is free of a sizing agent. In some embodiments, a carbon fiber substrate that is free of a sizing agent can be spread so as to facilitate deposition of a catalytic material thereon. In some embodiments, a carbon fiber substrate that is free of a sizing agent can have a barrier coating deposited thereon.

In some embodiments, the catalytic material and the non-catalytic material can be deposited by a technique or combination of techniques such as, for example, spray coating, dip coating, roller coating or a like solution-based deposition technique. In some embodiments, the catalytic material and the non-catalytic material can each be deposited from at least one solution. In some embodiments, the catalytic material can be deposited from a first solution, and the non-catalytic material can be deposited from a second solution. In such embodiments, the catalytic material can be deposited prior to, after or concurrently with the non-catalytic material. In other embodiments, the catalytic material and the non-catalytic material can be deposited concurrently from the same solution. In some embodiments, the at least one solution can contain water as a solvent.

In some embodiments, the catalytic material and the non-catalytic material can each have a concentration in the at least one solution ranging between about 0.1 mM and about 1.0 M. In other embodiments, the catalytic material and the non-catalytic material can each have a concentration in the at least one solution ranging between about 0.1 mM and about 50 mM, or between about 10 mM and about 100 mM, or between about 50 mM and about 1.0 M. When the catalytic material and the non-catalytic material are in the same solution, the referenced concentration ranges refer to the concentration of each component in the solution, rather than the overall solution concentration.

In some embodiments, the at least one solution containing the catalytic material can also contain hydrogen peroxide or a like oxidant. A significant advantage of using hydrogen peroxide in the at least one solution is that nanoparticulate catalyst precursors can be formed directly from soluble materials when the solution is deposited on a carbon fiber substrate. Inclusion of hydrogen peroxide in the at least one solution can be particularly advantageous when iron (II) acetate is used as the catalytic material. Without being bound by theory or mechanism, it is believed that a catalyst precursor formed from a reaction between hydrogen peroxide and iron (II) acetate can be converted into an active catalyst that is particularly efficacious for growing carbon nanotubes on carbon fiber substrates. Further, the catalyst solution containing hydrogen peroxide is a very stable aqueous solution which can be stored and used for extended periods of time. In contrast, when hydrogen peroxide is not present, the same catalyst solution can form precipitates during storage.

The solvent(s) used in the at least one solution can generally vary without limitation, provided that they effectively solubilize or disperse the catalytic material and the non-catalytic material, if present. Particularly suitable solvents can include, for example, water, alcohols (e.g., methanol, ethanol, or isopropanol), esters (e.g., methyl acetate or ethyl acetate), ketones (e.g., acetone or butanone), and mixtures thereof. In some embodiments, a small amount of a co-solvent can be added to achieve solubility of a transition metal salt in a solvent in which the salt is otherwise not sufficiently soluble. Illustrative examples of such co-solvents can include, for example, glyme, diglyme, triglyme, dimethylformamide, and dimethylsulfoxide. Generally, solvents having a relatively low boiling point are preferred such that the solvent can be easily removed prior to exposure of the carbon fiber substrate to the carbon nanotube growth conditions. Ready removal of the solvent can facilitate the formation of a homogenous coating of the catalytic material. In higher boiling point solvents or those that tend to pond on the surface of the carbon fiber substrate, a non-uniform distribution of the catalytic material can occur, thereby leading to poor carbon nanotube growth and coverage. In this regard, solvents that are effective in wetting the surface of the carbon fiber substrate can be particularly beneficial, since they can lead to a more uniform distribution of the catalytic material on the carbon fiber substrate.

Although inclusion of a non-catalytic material can generally be advantageous in the present processes, there can be an upper limit in the amount of non-catalytic material, above which carbon nanotube growth becomes difficult or infeasible. This can be particularly true when the non-catalytic material is deposited after or concurrently with the catalytic material. Such a limit does not necessarily apply when the non-catalytic material is deposited prior to the catalytic material. If too much non-catalytic material is included, the non-catalytic material can excessively overcoat the catalytic material, thereby inhibiting diffusion of a carbon feedstock gas into the catalytic material and blocking carbon nanotube growth. The same can also be true of a barrier coating when the catalytic material is deposited concurrently with the barrier coating. In some embodiments, a molar ratio of the non-catalytic material to the catalytic material can be at most about 8:1. In other embodiments, a molar ratio of the non-catalytic material to the catalytic material can be at most about 6:1. In still other embodiments, a molar ratio of the non-catalytic material to the catalytic material can be at most about 4:1. In still other embodiments, a molar ratio of the non-catalytic material to the catalytic material can be at most about 2:1.

After deposition of the catalytic material on the carbon fiber substrate, a chemical vapor deposition (CVD)-based process or other process for growing carbon nanotubes can be used to grow carbon nanotubes on the carbon fiber substrate. Illustrative processes for carbon nanotube synthesis can include, for example, micro-cavity, thermal or plasma-enhanced CVD techniques, laser ablation, arc discharge, flame synthesis and high pressure carbon monoxide (HiPCO) synthesis, all of which are known to one having ordinary skill in the art. In some embodiments, the CVD-based growth process can be plasma-enhanced. In some embodiments, the process for growing carbon nanotubes can take place continuously with the carbon fiber substrate being conveyed in a continuous manner through a reactor while being exposed to carbon nanotube growth conditions.

In the embodiments described herein, carbon nanotube growth can take place in a continuous (i.e., moving carbon fiber substrate) manner or under batchwise (i.e., static carbon fiber substrate) conditions. Generally, in order to facilitate high throughput syntheses suitable for commercial production, it can be preferable to transport the carbon fiber substrate during carbon nanotube growth. In non-limiting embodiments, growth of carbon nanotubes can take place in reactors that are adapted for continuous carbon nanotube growth. Illustrative reactors having such features are described in commonly owned U.S. patent application Ser. No. 12/611,101, which was previously incorporated by reference herein. Although the above reactors are designed for continuously conveying a substrate through the reactor for exposure to carbon nanotube growth conditions, the reactors can also be operated in a batchwise mode with the substrate remaining stationary, if desired. Other reactors that are adapted for batchwise carbon nanotube growth can also be used, if desired. Further details of an illustrative carbon nanotube growth reactor and certain process details for growing carbon nanotubes are set forth hereinafter. It should be noted that the processes described herein are not tied to a particular carbon nanotube reactor, and any suitable reactor known to one having ordinary skill in the art can be utilized in the present processes.

Carbon nanotube growth can be based on a chemical vapor deposition (CVD) process that occurs at elevated temperatures. The specific temperature is a function of catalyst choice, but can typically be in a range of about 500° C. to about 1000° C. In some embodiments, the temperature can be in a range of about 550° C. to about 800° C. In various embodiments, the temperature can influence the carbon nanotube growth rate and/or the carbon nanotube diameters obtained.

In various embodiments, carbon nanotube growth can take place by a CVD-based process, which can be plasma-enhanced. The CVD process can be promoted by a carbon-containing feedstock gas such as, for example, acetylene, ethylene, and/or methane. The carbon nanotube growth processes generally can use an inert gas (e.g., nitrogen, argon, and/or helium) as a primary carrier gas in conjunction with the carbon-containing feedstock gas. The carbon-containing feedstock gas is typically provided in a range from between about 0.1% to about 50% of the total mixture. In some embodiments, the carbon-containing feedstock gas can range between about 0.1% and about 10% of the total mixture. A substantially inert environment for CVD growth can be prepared by removal of moisture and oxygen from the growth chamber.

A strong plasma-creating electric field can optionally be employed to affect the direction of carbon nanotube growth. A plasma can be generated by providing an electric field during the growth process. By properly adjusting the geometry of the plasma spray and electric field, vertically aligned carbon nanotubes (i.e., perpendicular to the carbon fiber surface) can be synthesized. Under certain conditions, even in the absence of a plasma, closely-spaced carbon nanotubes can maintain a substantially vertical growth direction resulting in a dense array of carbon nanotubes resembling a carpet or forest.

In some embodiments, acetylene gas can be ionized to create a jet of cold carbon plasma for carbon nanotube synthesis. The carbon plasma can be directed toward the carbon fiber substrate during carbon nanotube synthesis. Thus, in some embodiments, processes for growing carbon nanotubes on a carbon fiber substrate can include (a) forming a carbon plasma; and (b) directing the carbon plasma onto the catalytic material disposed on the carbon fiber substrate. In some embodiments, a carbon fiber substrate can be actively heated to between about 550° C. and about 800° C. to facilitate carbon nanotube growth. To initiate the growth of carbon nanotubes, two or more gases are bled into the reactor: an inert carrier gas (e.g., argon, helium, or nitrogen) and a carbon-containing feedstock gas (e.g., acetylene, ethylene, ethane or methane).

In some embodiments, carbon nanotube growth can take place in a special rectangular reactor designed for continuous synthesis and growth of carbon nanotubes on fiber materials. Such a reactor is described in commonly-owned, co-pending patent application Ser. No. 12/611,101, incorporated by reference hereinabove. This reactor can utilize atmospheric pressure growth of carbon nanotubes, which facilitates its incorporation in a continuous carbon nanotube growth process. In addition, the reactor can be operated in a batchwise manner with the carbon fiber substrate being held stationary, if desired. More conventional reactors for static carbon nanotube growth can also be used. In some embodiments, carbon nanotubes can be grown via a CVD process at atmospheric pressure and an elevated temperature in the range of about 550° C. and about 800° C. in a multi-zone reactor. The fact that the carbon nanotube synthesis can occur at atmospheric pressure is one factor that can facilitate the incorporation of the reactor into a continuous processing line for carbon nanotube growth on the carbon fiber substrate. Another advantage consistent with in-line continuous processing using such a multi-zone reactor is that carbon nanotube growth can occur in seconds, as opposed to minutes (or longer), as in other procedures and apparatus configurations typical in the art.

Carbon nanotube synthesis reactors designed in accordance with the above embodiments can include the following features:

Rectangular Configured Synthesis Reactors: The cross-section of a typical carbon nanotube synthesis reactor known in the art is circular. There are a number of reasons for this including, for example, historical reasons (e.g., cylindrical reactors are often used in laboratories) and convenience (e.g., flow dynamics are easy to model in cylindrical reactors, heater systems readily accept circular tubes (e.g., quartz, etc.), and ease of manufacturing. Departing from the cylindrical convention, the present disclosure provides a carbon nanotube synthesis reactor having a rectangular cross section. The reasons for the departure include at least the following:

1) Inefficient Use of Reactor Volume. Since many carbon fiber substrates that are to be processed by the reactor are relatively planar (e.g., flat tapes, sheet-like forms, or spread tows or rovings), a circular cross-section is an inefficient use of the reactor volume. This inefficiency results in several drawbacks for cylindrical carbon nanotube synthesis reactors including, for example, a) maintaining a sufficient system purge; increased reactor volume requires increased gas flow rates to maintain the same level of gas purge, resulting in inefficiencies for high volume production of carbon nanotubes in an open environment; b) increased carbon-containing feedstock gas flow rates; the relative increase in inert gas flow for system purge, as per a) above, requires increased carbon-containing feedstock gas flow rates. Consider that the volume of an illustrative 12K glass fiber roving is approximately 2000 times less than the total volume of a synthesis reactor having a rectangular cross-section. In an equivalent cylindrical reactor (i.e., a cylindrical reactor that has a width that accommodates the same planarized glass fiber material as the rectangular cross-section reactor), the volume of the glass fiber material is approximately 17,500 times less than the volume of the reactor. Although gas deposition processes, such as CVD, are typically governed by pressure and temperature alone, volume can have a significant impact on the efficiency of deposition. With a rectangular reactor there is a still excess volume, and this excess volume facilitates unwanted reactions. However, a cylindrical reactor has about eight times that volume available for facilitating unwanted reactions. Due to the greater opportunity for competing reactions to occur, the desired reactions effectively occur more slowly in a cylindrical reactor. Such a slow down in carbon nanotube growth, can be problematic for the development of continuous growth processes. Another benefit of a rectangular reactor configuration is that the reactor volume can be decreased further still by using a small height for the rectangular chamber to make the volume ratio better and the reactions even more efficient. In some embodiments disclosed herein, the total volume of a rectangular synthesis reactor is no more than about 3000 times greater than the total volume of the carbon fiber substrate being passed through the synthesis reactor. In some further embodiments, the total volume of the rectangular synthesis reactor is no more than about 4000 times greater than the total volume of the carbon fiber substrate being passed through the synthesis reactor. In some still further embodiments, the total volume of the rectangular synthesis reactor is less than about 10,000 times greater than the total volume of the carbon fiber substrate being passed through the synthesis reactor. Additionally, it is notable that when using a cylindrical reactor, more carbon-containing feedstock gas is required to provide the same flow percent as compared to reactors having a rectangular cross section. It should be appreciated that in some other embodiments, the synthesis reactor has a cross-section that is described by polygonal forms that are not rectangular, but are relatively similar thereto and provide a similar reduction in reactor volume relative to a reactor having a circular cross section; and c) problematic temperature distribution; when a relatively small-diameter reactor is used, the temperature gradient from the center of the chamber to the walls thereof is minimal, but with increased reactor size, such as would be used for commercial-scale production, such temperature gradients increase. Temperature gradients result in product quality variations across the carbon fiber substrate (i.e., product quality varies as a function of radial position). This problem can be substantially avoided when using a reactor having a rectangular cross-section. In particular, when a planar substrate is used, reactor height can be maintained constant as the size of the substrate scales upward. Temperature gradients between the top and bottom of the reactor can be essentially negligible and, as a consequence, thermal issues and the product-quality variations that result are avoided.

2) Gas introduction. Because tubular furnaces are normally employed in the art, typical carbon nanotube synthesis reactors introduce gas at one end and draw it through the reactor to the other end. In some embodiments disclosed herein, gas can be introduced at the center of the reactor or within a target growth zone, symmetrically, either through the sides or through the top and bottom plates of the reactor. This improves the overall carbon nanotube growth rate because the incoming feedstock gas is continuously replenishing at the hottest portion of the system, which is where carbon nanotube growth is most active.

Zoning. Chambers that provide a relatively cool purge zone extend from both ends of the rectangular synthesis reactor. It has been determined that if a hot gas were to mix with the external environment (i.e., outside of the rectangular reactor), there would be increased degradation of the carbon fiber substrate. The cool purge zones provide a buffer between the internal system and external environments. Carbon nanotube synthesis reactor configurations known in the art typically require that the substrate is carefully (and slowly) cooled. The cool purge zone at the exit of the present rectangular carbon nanotube growth reactor achieves the cooling in a short period of time, as favorable for continuous in-line processing.

Non-contact, hot-walled, metallic reactor. In some embodiments, a metallic hot-walled reactor (e.g., stainless steel) can be employed. Use of this type of reactor can appear counterintuitive because metal, and stainless steel in particular, is more susceptible to carbon deposition (i.e., soot and by-product formation). Thus, most carbon nanotube synthesis reactors are made from quartz because there is less carbon deposited, quartz is easier to clean, and quartz facilitates sample observation. However, it has been observed that the increased soot and carbon deposition on stainless steel results in more consistent, efficient, faster, and stable carbon nanotube growth. Without being bound by theory it has been indicated that, in conjunction with atmospheric operation, the CVD process occurring in the reactor is diffusion limited. That is, the carbon nanotube-forming catalyst is "overfed;" too much carbon is available in the reactor system due to its relatively higher partial pressure (than if the reactor was operating under partial vacuum). As a consequence, in an open system, especially a clean one, too much carbon can adhere to the particles of carbon nanotube-forming catalyst, compromising their ability to synthesize carbon nanotubes. In some embodiments, the rectangular reactor is intentionally run when the reactor is "dirty," that is with soot deposited on the metallic reactor walls. Once carbon deposits to a monolayer on the walls of the reactor, carbon will readily deposit over itself. Since some of the available carbon is "withdrawn" due to this mechanism, the remaining carbon feedstock, in the form of radicals, reacts with the carbon nanotube-forming catalyst at a rate that does not poison the catalyst. Existing systems run "cleanly" which, if they were open for continuous processing, would produce a much lower yield of carbon nanotubes at reduced growth rates.

Although it is generally beneficial to perform carbon nanotube synthesis "dirty" as described above, certain portions of the apparatus (e.g., gas manifolds and inlets) can nonetheless negatively impact the carbon nanotube growth process when soot creates blockages. In order to combat this problem, such areas of the carbon nanotube growth reaction chamber can be protected with soot inhibiting coatings such as, for example, silica, alumina, or MgO. In practice, these portions of the apparatus can be dip-coated in these soot inhibiting coatings. Metals such as INVAR (a nickel-steel alloy commercially available from ArcelorMittal) can be used with these coatings as INVAR has a similar CTE (coefficient of thermal expansion) ensuring proper adhesion of the coating at higher temperatures, preventing the soot from significantly building up in critical zones.

Combined Catalyst Reduction and Carbon Nanotube Synthesis. In the carbon nanotube synthesis reactor disclosed herein, both catalyst reduction and carbon nanotube growth can occur within the reactor. In a typical process known in the art, a reduction step can typically take about 1-12 hours to perform. Both operations can occur in a reactor in accordance with the present disclosure due, at least in part, to the fact that carbon-containing feedstock gas is introduced at the center of the reactor, not the end as would be typical in the art using cylindrical reactors. The reduction process occurs as the carbon fiber substrate containing a catalyst precursor thereon enters the heated zone. By this point, the gas has had time to react with the walls and cool off prior to reducing the catalyst (via hydrogen radical interactions). In some embodiments, it can be this transition region where the reduction can occur. At the hottest isothermal zone in the system, carbon nanotube growth can occur, with the greatest growth rate occurring proximal to the gas inlets near the center of the reactor.

It is understood that modifications which do not substantially affect the activity of the various embodiments of this invention are also included within the definition of the invention provided herein. Accordingly, the following Examples are intended to illustrate but not limit the present invention.

EXAMPLE 1

Carbon Nanotube Growth Under Continuous CVD

Figure 1B:
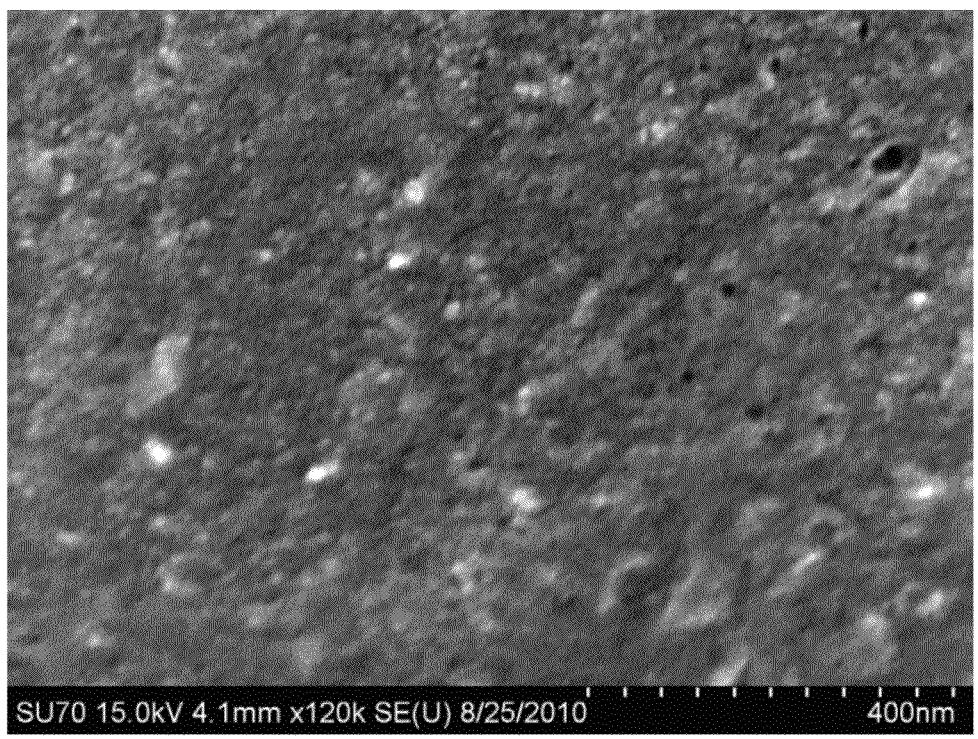
Figure 1C:
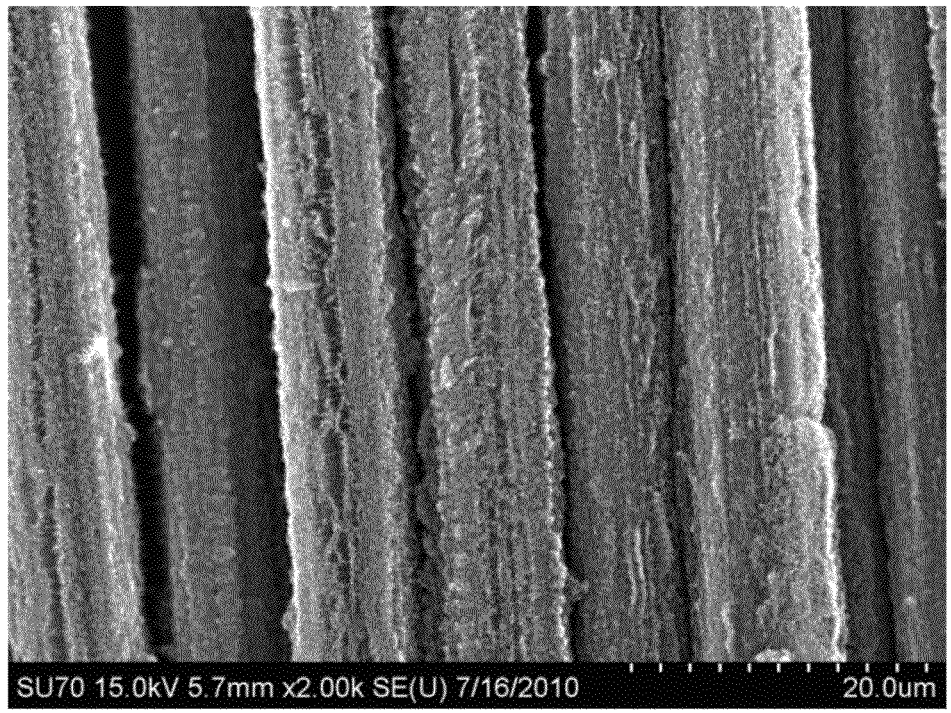
FIG. 1C shows an illustrative SEM image of carbon nanotubes grown on a carbon fiber substrate using an iron acetate catalyst precursor under continuous chemical vapor deposition conditions at a temperature of 650° C. and a linespeed of 2 ft/min, where the iron acetate catalyst precursor was deposited concurrently with a non-catalytic aluminum nitrate material upon an intermediate layer of non-catalytic glass material.
Figure 1D:
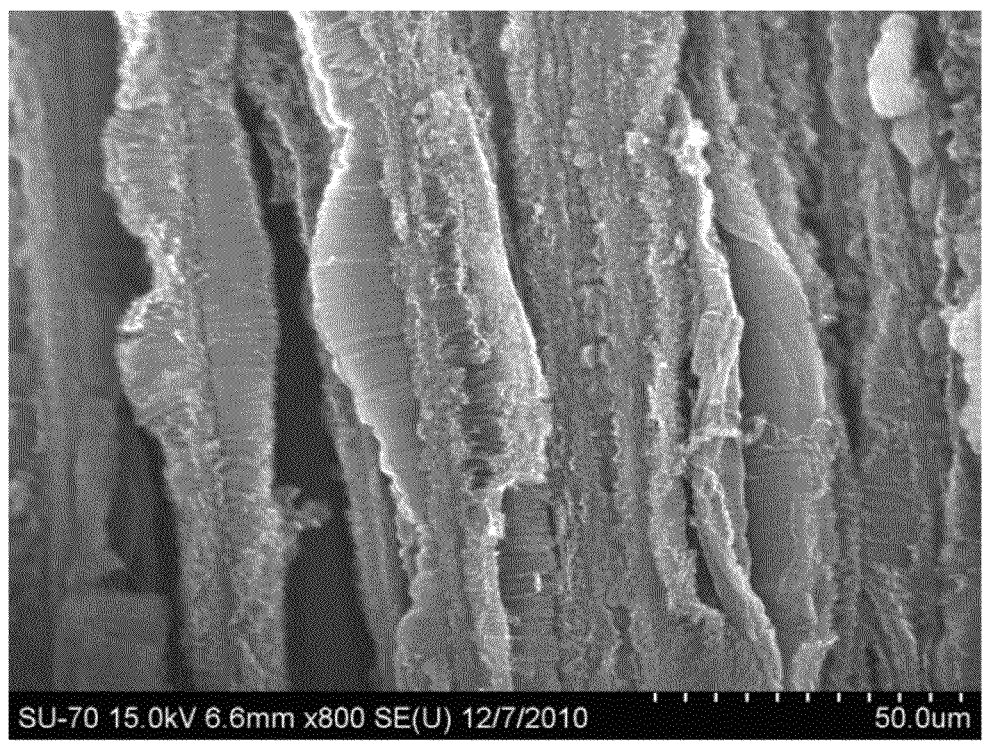
FIG. 1D shows an illustrative SEM image of carbon nanotubes grown on a carbon fiber substrate using an iron acetate catalyst precursor under continuous chemical vapor deposition conditions at a temperature of 750° C. and a linespeed of 2 ft/min, where the iron acetate catalyst precursor was deposited concurrently with a non-catalytic aluminum nitrate material upon an intermediate layer of non-catalytic glass material.

Conditions at 650° C. on a Carbon Fiber Substrate Using an Iron Catalyst and a Non-Catalytic Material, Deposited Upon an Intermediate Layer of Barrier Coating. For this example, a 2.5 vol. % solution of Accuglass T-11 Spin-On Glass (Honeywell International, Inc., Morristown, N.J.) was prepared in deionized water. The solution was then applied to a carbon fiber substrate via a dip coating process, and the solvent was removed with a heat gun (600° F.). A solution of 20 mM iron (II) acetate and 7.5 mM aluminum nitrate nonahydrate was prepared in deionized water and then applied to the carbon fiber substrate via a dip coating process, and the solvent was again removed with a heat gun (600° F.). FIGS. 1A and 1B show illustrative SEM images of a carbon fiber substrate coated with an iron acetate catalyst precursor deposited concurrently with a non-catalytic aluminum nitrate material upon an intermediate layer of non-catalytic glass material. As shown in FIG. 1A, the coating covered the entire surface of the carbon fiber. The use of a heat gun (600° F.) can allow for thermal decomposition to take place, resulting in the formation of catalytic nanoparticles as shown in FIG. 1B. The coated substrate was then transported through a continuous CVD carbon nanotube growth reactor at a temperature of 650° C. at a linespeed of 2 ft/min. Under these conditions, carbon nanotubes of up to ~3 μm in length were achieved, corresponding to carbon nanotube growth rates of up to ~0.05 μm/sec. FIG. 1C shows an illustrative SEM image of carbon nanotubes grown on a carbon fiber substrate using an iron acetate catalyst precursor under continuous chemical vapor deposition conditions at a temperature of 650° C. and a linespeed of 2 ft/min, where the iron acetate catalyst precursor was deposited concurrently with a non-catalytic aluminum nitrate material upon an intermediate layer of non-catalytic glass material. When the carbon nanotube growth was repeated at 750° C., longer carbon nanotubes of up to ~35 μm in length were observed for similar growth times, corresponding to carbon nanotube growth rates of up to ~0.58 μm/sec. FIG. 1D shows an illustrative SEM image of carbon nanotubes grown on a carbon fiber substrate using an iron acetate catalyst precursor under continuous chemical vapor deposition conditions at a temperature of 750° C. and a linespeed of 2 ft/min, where the iron acetate catalyst precursor was deposited concurrently with a non-catalytic aluminum nitrate material upon an intermediate layer of non-catalytic glass material.

EXAMPLE 2

Carbon Nanotube Growth Under Continuous CVD

Figure 2A:
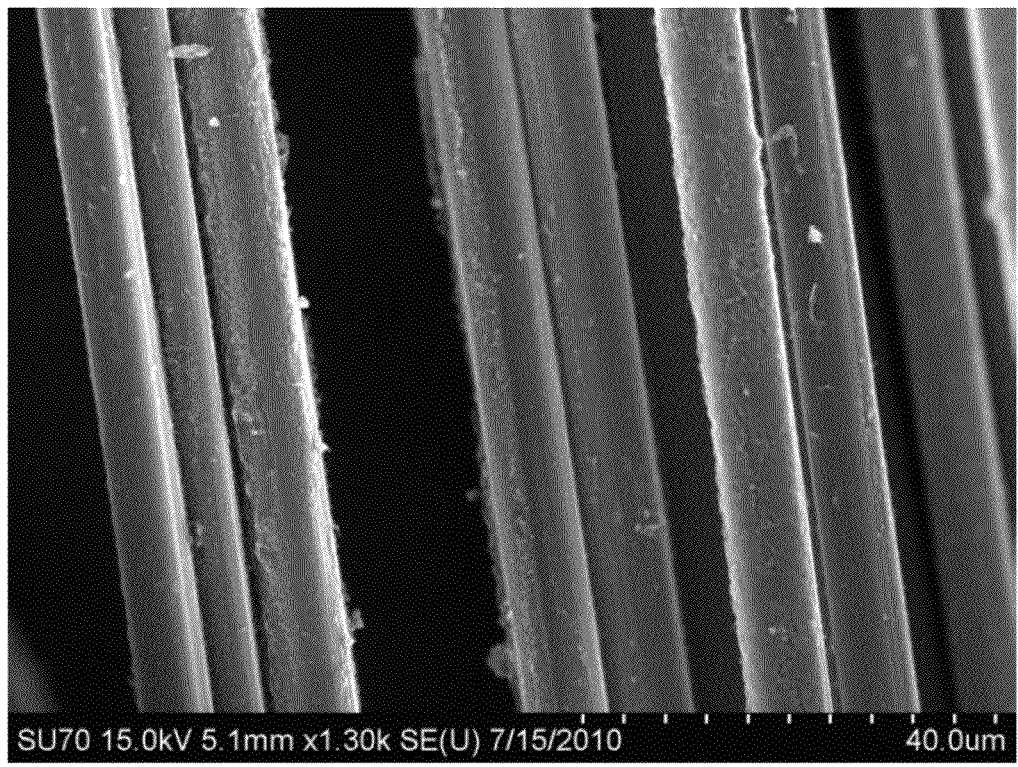
FIGS. 2A and 2B show illustrative SEM images of carbon nanotubes grown on a carbon fiber substrate using an iron acetate catalyst precursor under continuous chemical vapor deposition conditions at a temperature of 650° C. and a linespeed of 2 ft/min, where the iron acetate catalyst precursor was deposited upon an intermediate layer of non-catalytic glass material.
Figure 2B:
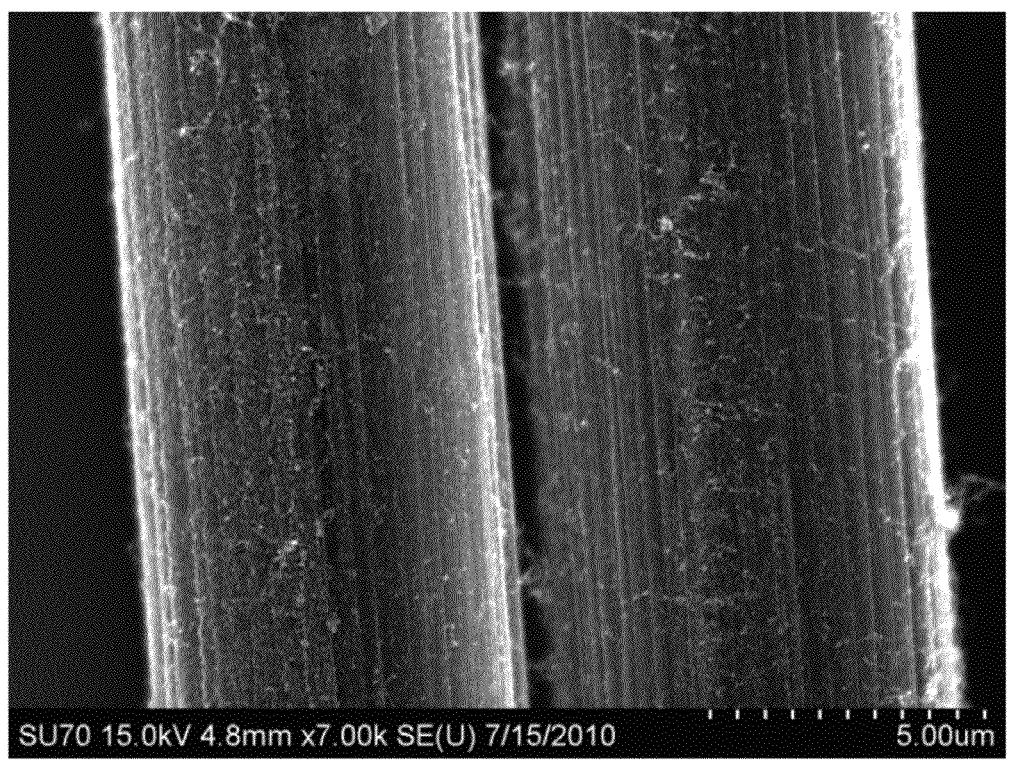

Conditions at 650° C. on a Carbon Fiber Substrate Using an Iron Catalyst, Deposited Upon an Intermediate Layer of Barrier Coating. The carbon nanotube growth of EXAMPLE 1 was repeated at 650° C., with the exception that the catalyst solution did not contain a non-catalytic aluminum nitrate material. For this example, a 2.5 vol. % solution of Accuglass T-11 Spin-On Glass (Honeywell International, Inc., Morristown, N.J.) was prepared in deionized water. The solution was then applied to the carbon fiber substrate via a dip coating process, and the solvent was removed with a heat gun (600° F.). A solution of 20 mM iron (II) acetate in deionized water was then applied to the carbon fiber substrate via a dip coating process, and the solvent was again removed with a heat gun (600° F.). The coated substrate was then transported through a continuous CVD carbon nanotube growth reactor at a temperature of 650° C. at a linespeed of 2 ft/min. Under these conditions, carbon nanotubes of up to ~1.5 μm in length were achieved, corresponding to carbon nanotube growth rates of up to ~0.025 μm/sec. FIGS. 2A and 2B show illustrative SEM images of carbon nanotubes grown on a carbon fiber substrate using an iron acetate catalyst precursor under continuous chemical vapor deposition conditions at a temperature of 650° C. and a linespeed of 2 ft/min, where the iron acetate catalyst precursor was deposited upon an intermediate layer of non-catalytic glass material. Compared to EXAMPLE 1, carbon nanotube growth and coverage was considerably less prevalent.

EXAMPLE 3

Carbon Nanotube Growth Under Continuous CVD

Conditions at 780° C. on a Carbon Fiber Substrate Using an Iron Catalyst, Hydrogen Peroxide and a Non-Catalytic Material, Deposited Upon an Intermediate Layer of Barrier Coating. The carbon nanotube growth of EXAMPLE 1 was repeated at 780° C., with the exception that the catalyst solution contained hydrogen peroxide and a higher concentration of iron acetate. For this example, a 2.5 vol. % solution of Accuglass T-11 Spin-On Glass (Honeywell International, Inc., Morristown, N.J.) was prepared in deionized water. The solution was then applied to the carbon fiber substrate via a dip coating process, and the solvent was removed with a heat gun (600° F.). A solution of 40 mM iron (II) acetate, 7.5 mM aluminum nitrate nonahydrate and 0.015 vol. % hydrogen peroxide was prepared in deionized water and applied to the carbon fiber substrate via a dip coating process, and the solvent was again removed with a heat gun (600° F.). The coated substrate was then transported through a continuous CVD carbon nanotube growth reactor at a temperature of 780° C. and a linespeed of 2 ft/min. Under these conditions, carbon nanotubes of up to ~80 μm in length were achieved, corresponding to carbon nanotube growth rates of up to ~1.3 μm/sec.

EXAMPLE 4

Carbon Nanotube Growth Under Continuous CVD

Figure 3:
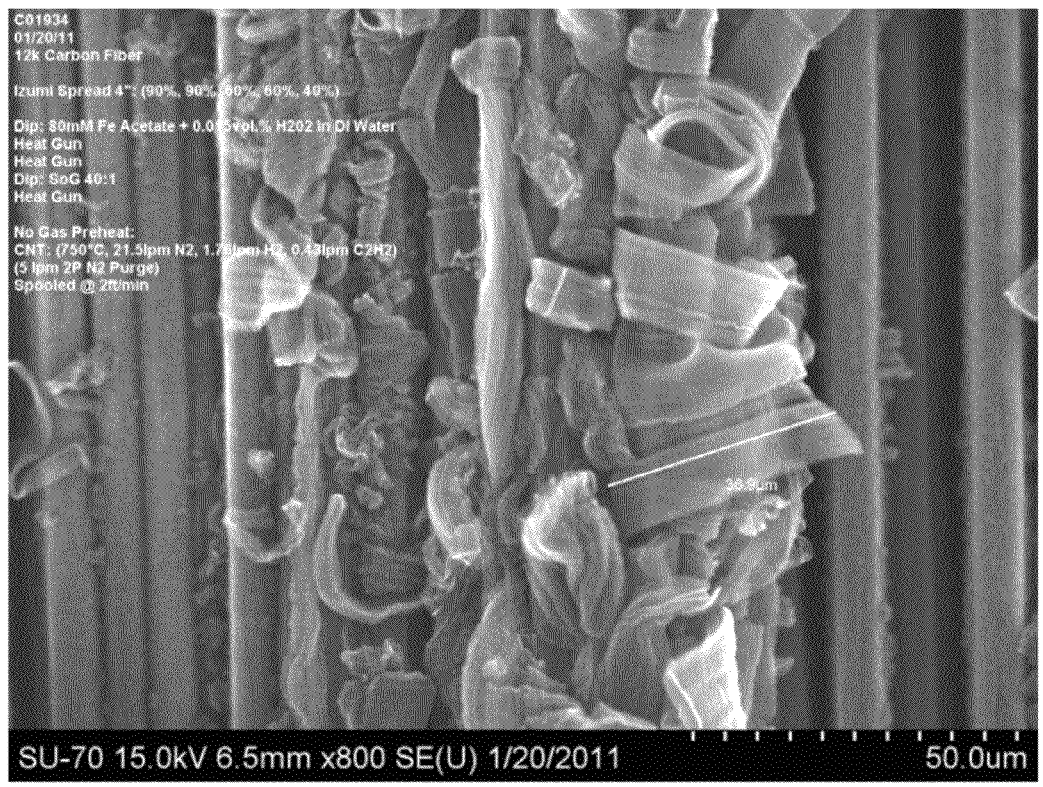
FIG. 3 shows an illustrative SEM image of carbon nanotubes grown on a carbon fiber substrate using an iron acetate catalyst precursor under continuous chemical vapor deposition conditions at a temperature of 750° C. and a linespeed of 2 ft/min, where the iron acetate catalyst precursor was deposited concurrently with a non-catalytic aluminum nitrate material beneath a layer of non-catalytic glass material.

Conditions at 750° C. on a Carbon Fiber Substrate Using an Iron Catalyst, Hydrogen Peroxide and a Non-Catalytic Material, Deposited Beneath an Intermediate Layer of Barrier Coating. The carbon nanotube growth of EXAMPLE 3 was repeated at 750° C., with the exception that the order of addition of the non-catalytic intermediate layer and the catalyst solution was reversed. For this example, a solution of 80 mM iron (II) acetate, 15 mM aluminum nitrate nonahydrate and 0.015 vol. % hydrogen peroxide was prepared in deionized water. The solution was then applied to the carbon fiber substrate via a dip coating process, and the solvent was removed with a heat gun (600° F.). A 2.5 vol. % solution of Accuglass T-11 Spin-On Glass (Honeywell International, Inc., Morristown, N.J.) was prepared in isopropanol and applied to the carbon fiber substrate via a dip coating process, and the solvent was again removed with a heat gun (600° F.). The coated substrate was then transported through a continuous CVD carbon nanotube growth reactor at a temperature of 750° C. at a linespeed of 2 ft/min. Under these conditions, carbon nanotubes of up to ~40 μm in length were achieved, corresponding to carbon nanotube growth rates of up to ~0.67 μm/sec. FIG. 3 shows an illustrative SEM image of carbon nanotubes grown on a carbon fiber substrate using an iron acetate catalyst precursor under continuous chemical vapor deposition conditions at a temperature of 750° C. and a linespeed of 2 ft/min, where the iron acetate catalyst precursor was deposited concurrently with a non-catalytic aluminum nitrate material beneath a layer of non-catalytic glass material.

As shown in FIG. 3, carbon nanotube growth from a 'reversed' coating order resulted in carbon nanotube lengths that were less consistent throughout the fiber substrate. It should be noted, however, that there can be certain benefits associated with this coating style, including a greater ability to maintain and in many cases improve the strength of the substrate. In addition, such a coating style can result in the non-catalytic material being lifted off of the substrate surface onto the tips of the carbon nanotubes. The ability to remove an insulating material from the surface of the substrate can be beneficial for electrical and thermal applications, as well as interfacial mechanical properties.

EXAMPLE 5

Carbon Nanotube Growth Under Continuous CVD

Figure 4:
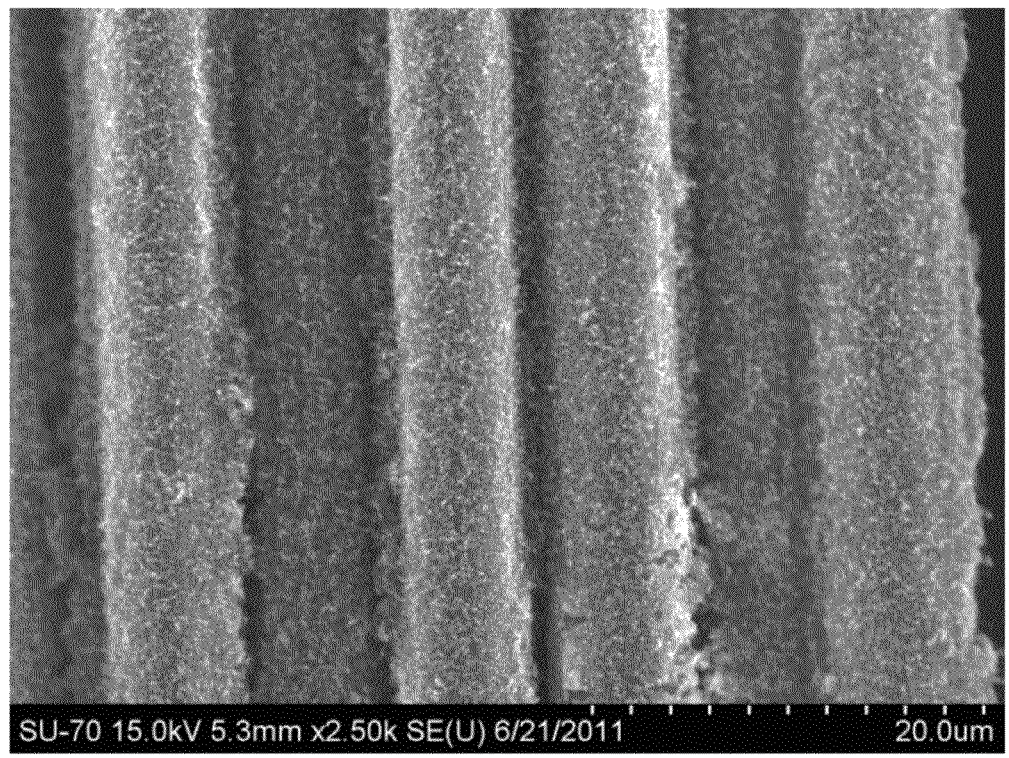
FIG. 4 shows an illustrative SEM image of carbon nanotubes grown on a carbon fiber substrate using an iron acetate catalyst precursor under continuous chemical vapor deposition conditions at a temperature of 675° C. and a linespeed of 2 ft/min, where the iron acetate catalyst precursor was deposited concurrently with a non-catalytic aluminum nitrate material and a non-catalytic glass material.

Conditions at 675° C. on a Carbon Fiber Substrate Using an Iron Catalyst, Hydrogen Peroxide and a Non-Catalytic Material, Deposited Concurrently with a Barrier Coating. The carbon nanotube growth of EXAMPLE 3 was repeated at 675° C., with the exception that the catalyst solution was deposited concurrently with a non-catalytic glass material. For this example, a solution of 100 mM iron (II) acetate, 18.75 mM aluminum nitrate nonahydrate, 0.015 vol. % hydrogen peroxide and 1.25 vol. % of Accuglass T-11 Spin-On Glass (Honeywell International, Inc., Morristown, N.J.) was prepared in deionized water. The solution was then applied to the carbon fiber substrate via a dip coating process, and the solvent was removed with a heat gun (600° F.). The coated substrate was then transported through a continuous CVD carbon nanotube growth reactor at a temperature of 675° C. and a linespeed of 2 ft/min. Under these conditions, carbon nanotubes of up to ~2 μtm in length were achieved, corresponding to carbon nanotube growth rates of up to ~0.03 μm/sec. FIG. 4 shows an illustrative SEM image of carbon nanotubes grown on a carbon fiber substrate using an iron acetate catalyst precursor under continuous chemical vapor deposition conditions at a temperature of 675° C. and a linespeed of 2 ft/min, where the iron acetate catalyst precursor was deposited concurrently with a non-catalytic aluminum nitrate material and a non-catalytic glass material. As shown in FIG. 4, the carbon nanotubes grown from a single aqueous solution appeared to have a fairly uniform length and maintained significant coverage on the fiber surface.

EXAMPLE 6

Carbon Nanotube Growth Under Continuous CVD

Conditions at 750° C. on a Carbon Fiber Substrate Using an Iron and Cobalt Catalyst, Deposited Beneath an Intermediate Layer of Barrier Coating. The carbon nanotube growth of EXAMPLE 4 was repeated at 750° C., with the exception that a different catalyst solution utilizing alternative catalyst precursors was utilized. For this example, a solution of 500 mM iron ammonium (III) citrate, 518 mM cobalt (II) acetate tetrahydrate and 1.0 vol. % ammonia was prepared in deionized water. The solution was then applied to the carbon fiber substrate via a dip coating process, and the solvent was removed with a heat gun (600° F.). A 2.5 vol. % solution of Accuglass T-11 Spin-On Glass (Honeywell International, Inc., Morristown, N.J.) was prepared in isopropanol and applied to the carbon fiber substrate via a dip coating process, and the solvent was again removed with a heat gun (600° F.). The coated substrate was then transported through a continuous CVD carbon nanotube growth reactor at a temperature of 750° C. and a linespeed of 2 ft/min. Under these conditions, carbon nanotubes of up to ~40 μm in length were achieved, corresponding to carbon nanotube growth rates of up to ~0.67 μm/sec.

EXAMPLE 7

Carbon Nanotube Growth Under Continuous CVD

Figure 5:
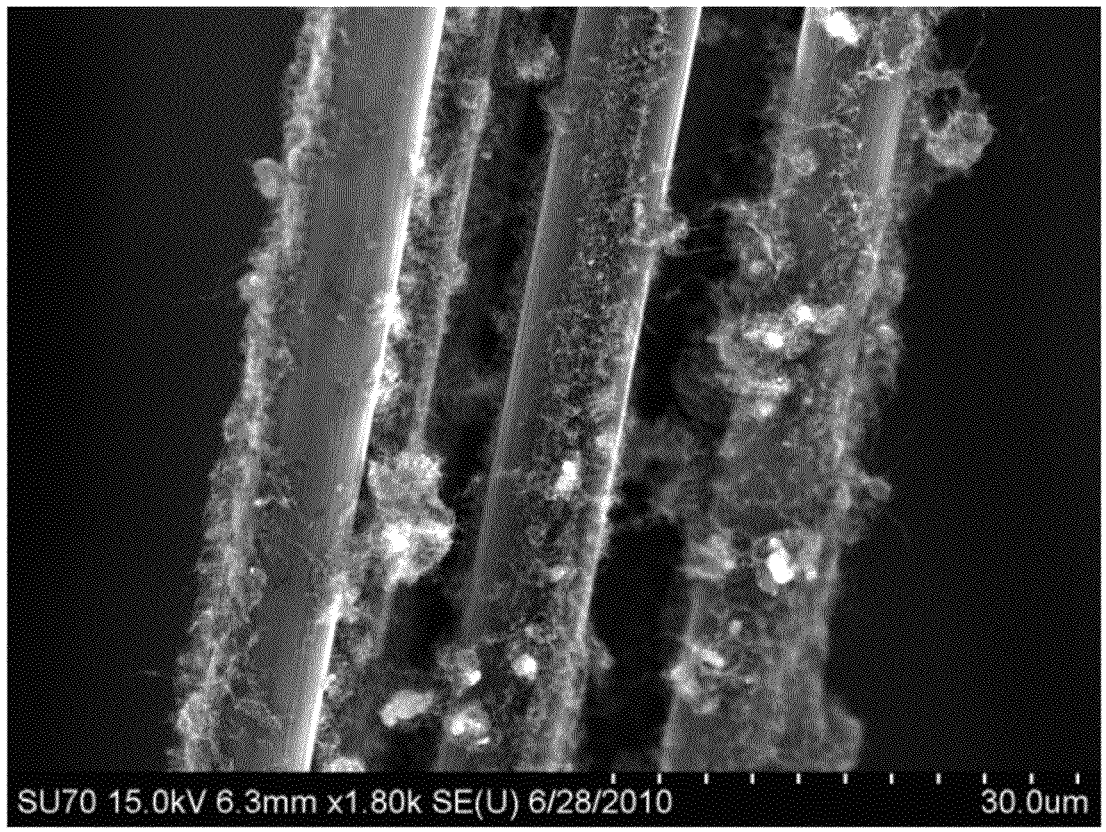
FIG. 5 shows an illustrative SEM image of carbon nanotubes grown on a carbon fiber substrate using an iron nitrate catalyst precursor under continuous chemical vapor deposition conditions at a temperature of 750° C. and a linespeed of 2 ft/min, where the iron acetate catalyst precursor was deposited concurrently with a non-catalytic aluminum nitrate material beneath a layer of non-catalytic glass material.

Conditions at 750° C. on a Carbon Fiber Substrate Using an Iron Catalyst and a Non-Catalytic Material, Deposited Beneath an Intermediate Layer of Barrier Coating. The carbon nanotube growth of EXAMPLE 4 was repeated at 750° C., with the exception that an alternative iron salt catalyst precursor was utilized. For this example, a solution of 40 mM iron (III) nitrate nonahydrate and 10 mM aluminum nitrate nonahydrate was prepared in deionized water. The solution was then applied to the carbon fiber substrate via a dip coating process, and the solvent was removed with a heat gun (600° F.). A 2.5 vol. % solution of Accuglass T-11 Spin-On Glass (Honeywell International, Inc., Morristown, N.J.) was prepared in deionized water and applied to the carbon fiber substrate via a dip coating process, and the solvent was again removed with a heat gun (600° F.). The coated substrate was then transported through a continuous CVD carbon nanotube growth reactor at a temperature of 750° C. and a linespeed of 2 ft/min. Under these conditions, carbon nanotubes of up to ~5 μm in length were achieved, corresponding to carbon nanotube growth rates of up to ~0.08 μm/sec. FIG. 5 shows an illustrative SEM image of carbon nanotubes grown on a carbon fiber substrate using an iron nitrate catalyst precursor under continuous chemical vapor deposition conditions at a temperature of 750° C. and a linespeed of 2 ft/min, where the iron nitrate catalyst precursor was deposited concurrently with a non-catalytic aluminum nitrate material beneath a layer of non-catalytic glass material. As shown in FIG. 5, the carbon nanotube growth rate and coverage was lower with this catalytic material.

Although the invention has been described with reference to the disclosed embodiments, one having ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is the following:

1. A carbon nanotube growth process comprising:
   depositing a catalyst precursor on a carbon fiber substrate;
   wherein the catalyst precursor is deposited from a solution comprising a transition metal salt, hydrogen peroxide, and water as a solvent; and
   after depositing the catalyst precursor, exposing the carbon fiber substrate to carbon nanotube growth conditions so as to grow carbon nanotubes thereon;
   wherein the carbon nanotube growth conditions convert the catalyst precursor into a catalyst that is operable for growing carbon nanotubes.

2. The carbon nanotube growth process of claim 1, further comprising:
   transporting the carbon fiber substrate while the carbon nanotubes are being grown.

3. The carbon nanotube growth process of claim 1, wherein the carbon fiber substrate is free of a sizing agent.

4. The carbon nanotube growth process of claim 1, wherein the carbon fiber substrate is coated with a barrier coating.

5. The carbon nanotube growth process of claim 4, wherein the barrier coating is selected from the group consisting of an alkoxysilane, an alkylsiloxane, an alumoxane, alumina nanoparticles, spin on glass, glass nanoparticles and combinations thereof.

6. The carbon nanotube growth process of claim 1, wherein the transition metal salt is selected from the group consisting of a transition metal nitrate, a transition metal acetate, a transition metal citrate, a transition metal chloride, hydrates thereof, and combinations thereof.

7. The carbon nanotube growth process of claim 6, wherein the transition metal salt is selected from the group consisting of iron (II) nitrate, iron (III) nitrate, cobalt (II) nitrate, nickel (II) nitrate, copper (II) nitrate, iron (II) acetate, iron (III) acetate, cobalt (II) acetate, nickel (II) acetate, copper (II) acetate, iron (II) citrate, iron (III) citrate, iron (III) ammonium citrate, cobalt (II) citrate, nickel (II) citrate, copper (II) citrate, iron (II) chloride, iron (III) chloride, cobalt (II) chloride, nickel (II) chloride, copper (II) chloride, hydrates thereof, and combinations thereof.

8. A carbon nanotube growth process comprising:
   depositing a catalyst precursor on a carbon fiber substrate that is free of a sizing agent;
   wherein the catalyst precursor is deposited from a solution comprising a transition metal salt, hydrogen peroxide, and water as a solvent;
   after depositing the catalyst precursor, exposing the carbon fiber substrate to carbon nanotube growth conditions so as to grow carbon nanotubes thereon;
   wherein the carbon nanotube growth conditions convert the catalyst precursor into a catalyst that is operable for growing carbon nanotubes; and
   transporting the carbon fiber substrate while the carbon nanotubes are being grown.

9. The carbon nanotube growth process of claim 8, further comprising:
   spreading the carbon fiber material.

10. The carbon nanotube growth process of claim 9, further comprising:
    applying a barrier coating to the carbon fiber material.

11. The carbon nanotube growth process of claim 10, wherein the barrier coating is selected from the group consisting of an alkoxysilane, an alkylsiloxane, an alumoxane, alumina nanoparticles, spin on glass, glass nanoparticles and combinations thereof.

12. The carbon nanotube growth process of claim 8, wherein the transition metal salt is selected from the group consisting of a transition metal nitrate, a transition metal acetate, a transition metal citrate, a transition metal chloride, hydrates thereof, and combinations thereof.

13. The carbon nanotube growth process of claim 12, wherein the transition metal salt is selected from the group consisting of iron (II) nitrate, iron (III) nitrate, cobalt (II) nitrate, nickel (II) nitrate, copper (II) nitrate, iron (II) acetate, iron (III) acetate, cobalt (II) acetate, nickel (II) acetate, copper (II) acetate, iron (II) citrate, iron (III) citrate, iron (III) ammonium citrate, cobalt (II) citrate, nickel (II) citrate, copper (II) citrate, iron (II) chloride, iron (III) chloride, cobalt (II) chloride, nickel (II) chloride, copper (II) chloride, hydrates thereof, and combinations thereof.

14. A carbon nanotube growth process comprising:
    providing a carbon fiber substrate that is free of a sizing agent and has a barrier coating deposited thereon;
    wherein the barrier coating is selected from the group consisting of an alkoxysilane, an alkylsiloxane, an alumoxane, alumina nanoparticles, spin on glass, glass nanoparticles and combinations thereof;
    depositing a catalyst precursor on the barrier coating;
    wherein the catalyst precursor is deposited from a solution comprising a transition metal salt, hydrogen peroxide, and water as a solvent;
    after depositing the catalyst precursor, exposing the carbon fiber substrate to carbon nanotube growth conditions so as to grow carbon nanotubes thereon;
    wherein the carbon nanotube growth conditions convert the catalyst precursor into a catalyst that is operable for growing carbon nanotubes; and
    transporting the carbon fiber substrate while the carbon nanotubes are being grown.

15. The carbon nanotube growth process of claim 14, wherein the catalyst precursor comprises an iron (II) salt or a hydrate thereof.

* * * * *